United States Patent
Kigoshi et al.

(10) Patent No.: US 10,522,743 B2
(45) Date of Patent: Dec. 31, 2019

(54) HALL ELEMENT MODULE

(71) Applicant: ROHM CO., LTD., Ukyo-ku, Kyoto (JP)

(72) Inventors: Satohiro Kigoshi, Kyoto (JP); Shinsei Mizuta, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days.

(21) Appl. No.: 16/153,327

(22) Filed: Oct. 5, 2018

(65) Prior Publication Data

US 2019/0044057 A1 Feb. 7, 2019

Related U.S. Application Data

(63) Continuation of application No. 15/833,722, filed on Dec. 6, 2017, now Pat. No. 10,128,434.

(30) Foreign Application Priority Data

Dec. 9, 2016 (JP) ................................ 2016-239381
Mar. 9, 2017 (JP) ................................ 2017-044811

(51) Int. Cl.
| | |
|---|---|
| *H01L 43/04* | (2006.01) |
| *H01L 43/06* | (2006.01) |
| *H01L 43/14* | (2006.01) |
| *G01R 15/20* | (2006.01) |
| *G01R 33/07* | (2006.01) |
| *H03B 15/00* | (2006.01) |
| *H01L 27/092* | (2006.01) |

(Continued)

(52) U.S. Cl.
CPC ............ *H01L 43/065* (2013.01); *H01L 43/04* (2013.01); *H01L 43/06* (2013.01); *G01R 15/202* (2013.01);

(Continued)

(58) Field of Classification Search
CPC ....... H01L 43/065; H01L 43/04; H01L 43/06; H01L 43/14; G01R 15/202; G01R 33/07; H03B 15/00

See application file for complete search history.

(56) References Cited

U.S. PATENT DOCUMENTS 4,972,241 A * 11/1990 Fukuda ................... H01L 43/06 257/414
5,198,795 A * 3/1993 Shibasaki ............. H01L 43/065 257/E43.003

(Continued)

FOREIGN PATENT DOCUMENTS

JP 61259583 A * 11/1986 ........... H01L 43/065
JP 2013197386 A 9/2013

(Continued)

*Primary Examiner* — Ida M Soward
(74) *Attorney, Agent, or Firm* — Hamre, Schumann, Mueller & Larson, P.C.

(57) ABSTRACT

The present invention provides a Hall element module for achieving miniaturization. A Hall element module includes a Hall element having an element surface and an element back surface, a terminal portion electrically connected to the Hall element and separated from the Hall element as viewed in a z direction, and a resin package covering at least one portion of each of the Hall element and the terminal. The resin package has a rectangular shape with four sides along the x direction and the y direction as viewed in the z direction. The terminal portion includes a terminal back surface facing the z direction and exposed from the resin package. An end edge of the terminal back surface includes a terminal back surface inclined portion opposed to the Hall element and inclined with respect to the x direction and the y direction as viewed in the z direction.

16 Claims, 25 Drawing Sheets

(51) Int. Cl.
  *H01L 29/49* (2006.01)
  *H01L 29/51* (2006.01)
  *H01L 29/66* (2006.01)

(52) U.S. Cl.
  CPC .......... *G01R 33/07* (2013.01); *H01L 27/0924* (2013.01); *H01L 29/4966* (2013.01); *H01L 29/517* (2013.01); *H01L 29/518* (2013.01); *H01L 29/66545* (2013.01); *H01L 43/14* (2013.01); *H03B 15/00* (2013.01)

(56) References Cited

U.S. PATENT DOCUMENTS

| | | | | |
|---|---|---|---|---|
| 5,614,754 A * | 3/1997 | Inoue | .................... | H01L 43/065 257/421 |
| 6,781,358 B2 * | 8/2004 | Goto | .................... | G01R 15/202 324/117 H |
| 6,812,687 B1 * | 11/2004 | Ohtsuka | ............... | G01R 15/202 324/117 H |
| 7,598,601 B2 * | 10/2009 | Taylor | .................. | G01R 15/207 174/536 |
| 9,176,170 B2 * | 11/2015 | Racz | .................... | G01R 15/202 |
| 9,748,473 B2 * | 8/2017 | Willett | .................. | H01L 43/065 |
| 2005/0086794 A1 * | 4/2005 | Fukunaka | ............ | G01R 33/07 29/603.01 |
| 2015/0102807 A1 * | 4/2015 | Eckinger | ............. | G01R 33/072 324/251 |
| 2017/0040185 A1 * | 2/2017 | Fuwa | ............... | H01L 21/4803 |

FOREIGN PATENT DOCUMENTS

| | | | | |
|---|---|---|---|---|
| WO | WO-2016047130 A1 * | 3/2016 | ............ | H01L 24/97 |
| WO | WO-2016051726 A1 * | 4/2016 | ............ | G01R 33/07 |

* cited by examiner

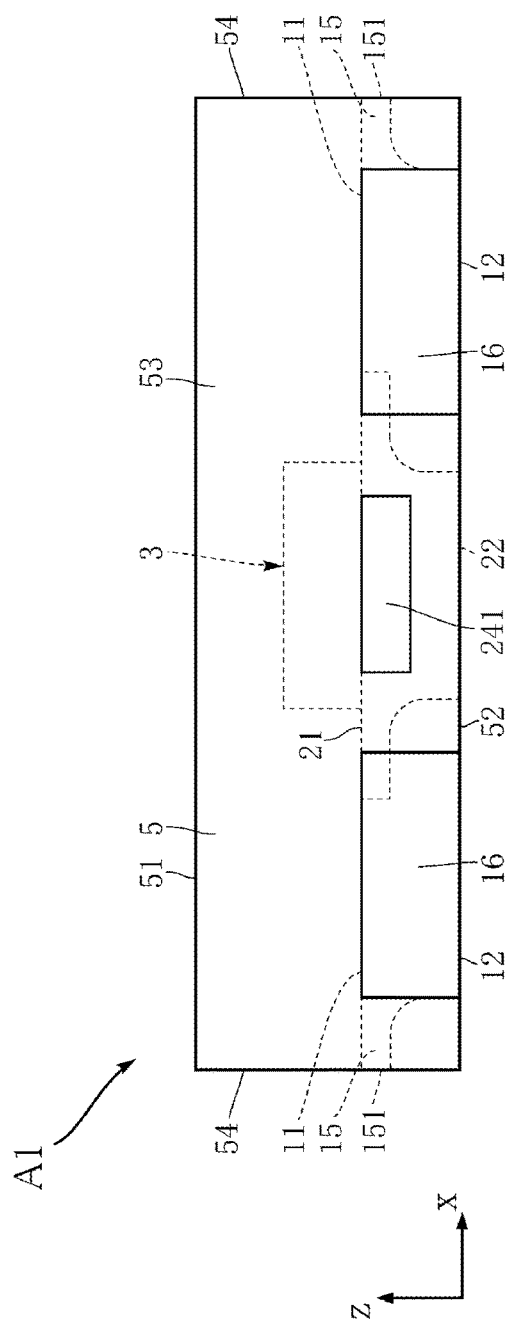
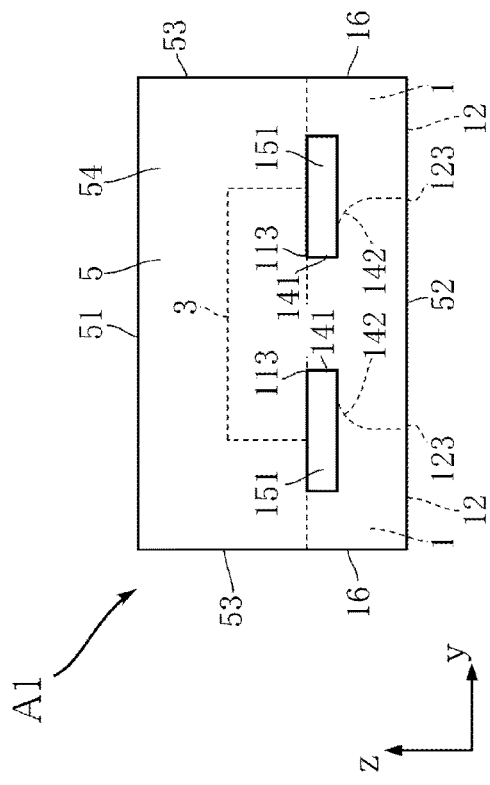

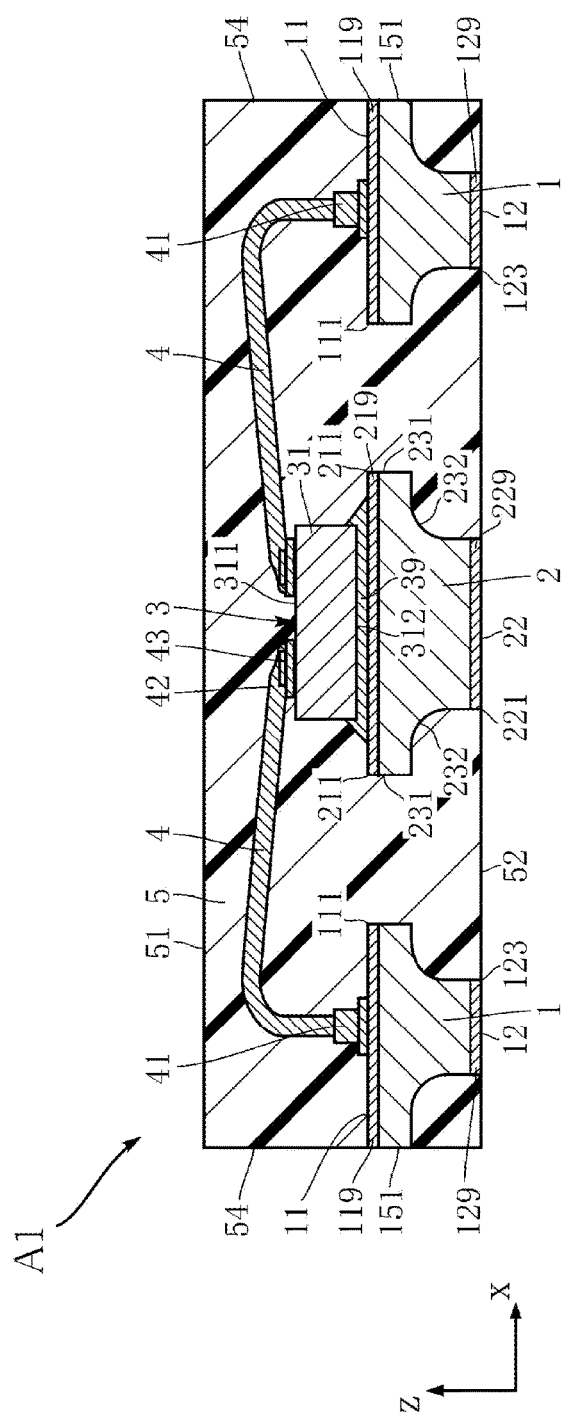
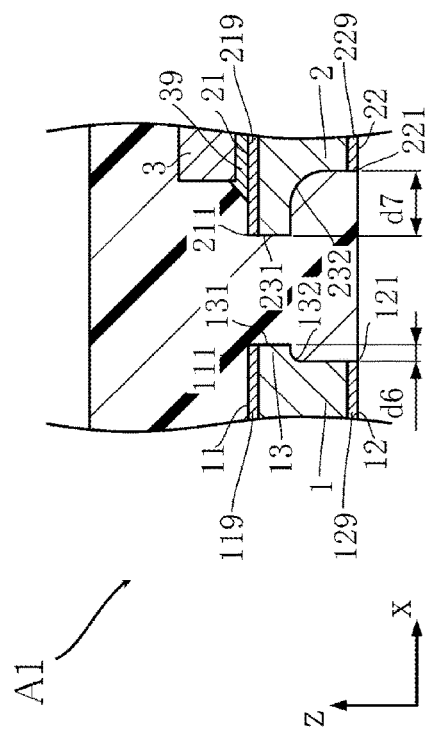
Figure 6
Figure 7

HALL ELEMENT MODULE

TECHNICAL FIELD

The present invention relates to a Hall element module.

BACKGROUND

Patent Literature 1 discloses an embodiment of a Hall element module having a Hall element mounted therein. In the patent literature, the Hall element module includes a lead electrically connected to the Hall element; and a resin package covering a portion of the Hall element and the lead.

This Hall element module is required to be further miniaturized. In the Hall element module of the patent literature, it cannot be said that the arrangement of the Hall element and the lead, their respective shapes and the like have been sufficiently miniaturized.

BACKGROUND TECHNICAL LITERATURES

Patent Literatures

[Patent Literature 1] Japanese Patent Application Laid-Open Publication No. 2013-197386.

BRIEF SUMMARY OF THE INVENTION

Problems to be Solved

The present invention has been made based on the above circumstances, and an object of the present invention is to provide a Hall element module that can be miniaturized.

Technical Means for Solving Problems

The present invention provides a Hall element module, including a Hall element having an element surface and an element back surface; a terminal portion electrically connected to the Hall element and spaced apart from the Hall element in a thickness direction; and a resin package covering at least a portion of each of the Hall element and the terminal portion. The resin package is in a rectangular shape as viewed in the thickness direction and has four sides along a first direction and a second direction, which are perpendicular to the thickness direction and perpendicular to each other. The terminal portion has a terminal back surface facing the thickness direction and exposed from the resin package, and an end edge of the terminal back surface has a terminal back surface inclined portion opposed to the Hall element as viewed in the thickness direction and inclined with respect to the first direction and the second direction.

In an embodiment of the present invention, preferably, the terminal portion has a terminal surface facing opposite to the terminal back surface in the thickness direction, and the terminal surface has a terminal surface inclined portion opposed to the Hall element as viewed in the thickness direction and inclined with respect to the first direction and the second direction.

In an embodiment of the present invention, preferably, the terminal surface inclined portion is closer to the Hall element than the terminal back surface inclined portion, and the terminal portion has a terminal first thin wall portion between the terminal surface inclined portion and the terminal back surface inclined portion as viewed in the thickness direction and thinner than a distance between the terminal surface and the terminal back surface.

In an embodiment of the present invention, preferably, the terminal surface inclined portion and the terminal back surface inclined portion are parallel to each other.

In an embodiment of the present invention, preferably, the end edge of the terminal back surface has a terminal back surface front portion connected to the terminal back surface inclined portion and along the second direction and located closest to the Hall element in the first direction, and a length of the terminal back surface inclined portion is longer than a length of the terminal back surface front portion.

In an embodiment of the present invention, preferably, an end edge of the terminal surface has a terminal surface front portion connected to the terminal surface inclined portion and along the second direction and located closest to the Hall element in the first direction, and a length of the terminal surface inclined portion is longer than a length of the terminal surface front portion.

In an embodiment of the present invention, preferably, the terminal surface front portion and the terminal back surface front portion coincide with each other as viewed in the thickness direction.

In an embodiment of the present invention, preferably, the end edge of the terminal back surface has a terminal back surface side portion connected to the terminal back surface inclined portion and along the first direction, the end edge of the terminal surface has a terminal surface side portion connected to the terminal surface inclined portion and along the first direction, the terminal surface inclined portion is separated from the terminal back surface inclined portion as viewed in the thickness direction more than the terminal back surface inclined portion, the terminal portion has a terminal second thin wall portion between the terminal surface side portion and the terminal back surface side portion as viewed in the thickness direction and thinner than a distance between the terminal surface and the terminal back surface.

In an embodiment of the present invention, preferably, the terminal surface side portion and the terminal back surface side portion are parallel to each other.

In an embodiment of the present invention, preferably, the terminal portion has a terminal third thin wall portion connected to the terminal second thin wall portion and extending opposite to the Hall element in the first direction.

In an embodiment of the present invention, preferably, an island portion has an island surface mounted with the Hall element, and an island back surface exposed from the resin package.

In an embodiment of the present invention, preferably, an end edge of the island back surface has an island back surface inclined portion opposed to the terminal back surface inclined portion and inclined with respect to the first direction and the second direction.

In an embodiment of the present invention, preferably, the island back surface inclined portion and the terminal back surface inclined portion are parallel to each other.

In an embodiment of the present invention, preferably, an end edge of the island surface has an island surface inclined portion opposed to the terminal surface inclined portion and inclined with respect to the first direction and the second direction.

In an embodiment of the present invention, preferably, the island surface inclined portion and the island back surface inclined portion are parallel to each other.

In an embodiment of the present invention, preferably, the island surface inclined portion is closer to the terminal portion than the island back surface inclined portion; and the island portion has an island first thin wall portion between the island surface inclined portion and the island back surface inclined portion as viewed in the thickness direction and thinner than a distance between the island surface and the island back surface.

In an embodiment of the present invention, preferably, the island portion has an island second thin wall portion connected to the island first thin wall portion and extending in the second direction.

In an embodiment of the present invention, preferably, four terminal portions surrounding the island portion are included.

In an embodiment of the present invention, preferably, a distance between the terminal surface inclined portion and the island surface inclined portion is smaller than a distance between the terminal surface side portions of adjacent terminal portions in the second direction.

In an embodiment of the present invention, preferably, a distance between the terminal surface front portion and the island second thin wall portion in the first direction is smaller than a distance between the terminal surface side portions of adjacent terminal portions in the second direction.

In an embodiment of the present invention, preferably, a connecting thin wall portion connecting the terminal portion and the island portion is included.

In an embodiment of the present invention, preferably, the element back surface is exposed from the resin package.

In an embodiment of the present invention, preferably, the Hall element is in a square shape in the thickness direction and diagonal lines of the Hall element are arranged along the first direction and the second direction.

Other features and advantages of the present invention will become more apparent from the following detailed description with the accompanying drawings.

BRIEF DESCRIPTION OF THE DRAWINGS

FIG. 4 is a front view of the Hall element module of FIG. 1.

FIG. 5 is a side view of the Hall element module of FIG. 1.

FIG. 6 is a cross-sectional view along line VI-VI of FIG. 2.

FIG. 7 is a cross-sectional view along line VII-VII of FIG. 2.

DETAILED DESCRIPTION

Figure 1:
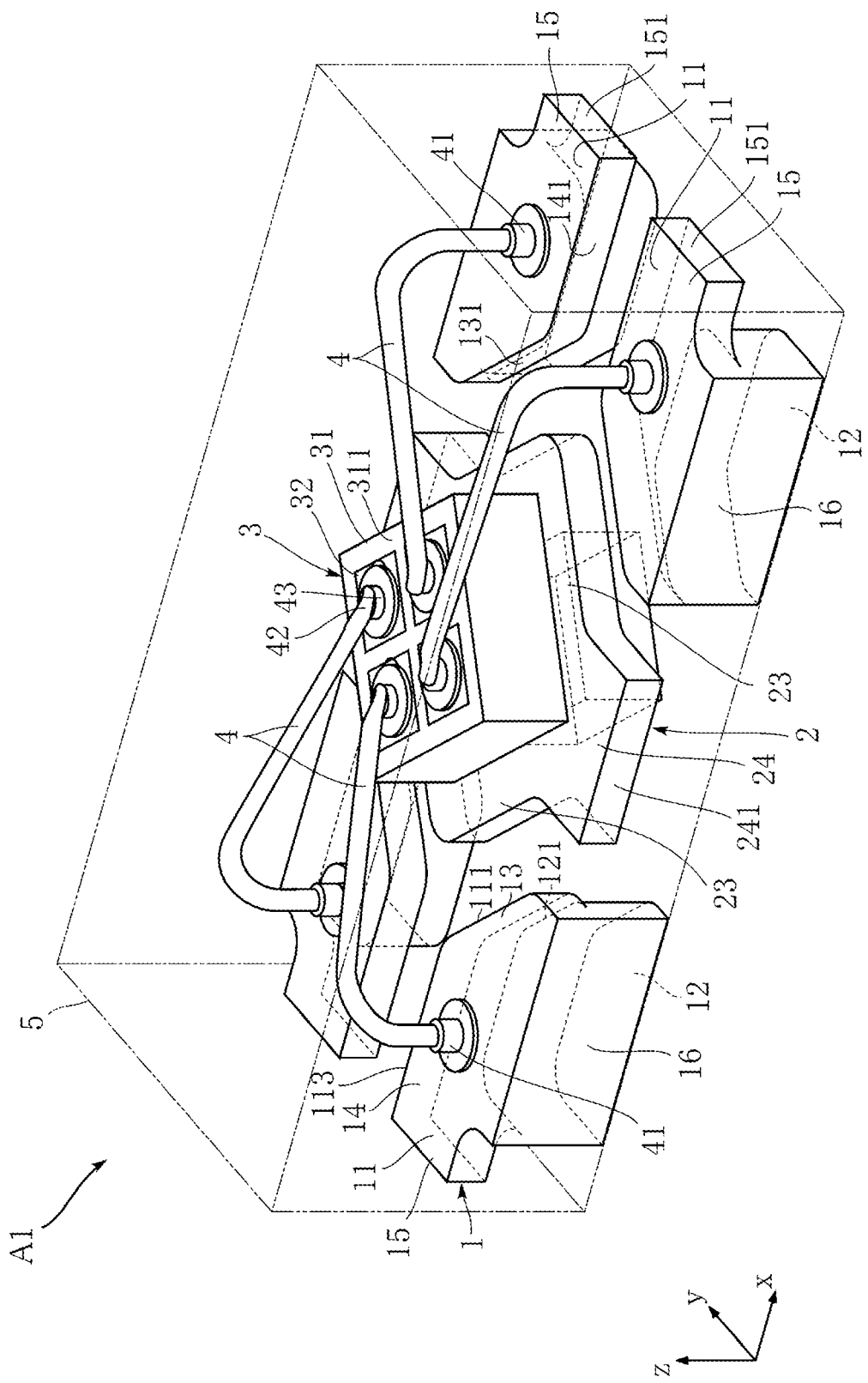
FIG. 1 is a perspective view showing a Hall element module according to the first embodiment of the present invention.

The implementation of the present invention (hereinafter referred to as "embodiments") will be described with reference to the accompanying drawings.

First Embodiment

FIG. 1 to FIG. 10 show a Hall element module A1 according to the first embodiment of the present invention. In the present embodiment, the Hall element module A1 includes four terminal portions 1, an island portion 2, a Hall element 3, four wires 4 and a resin package 5.

Figure 2:
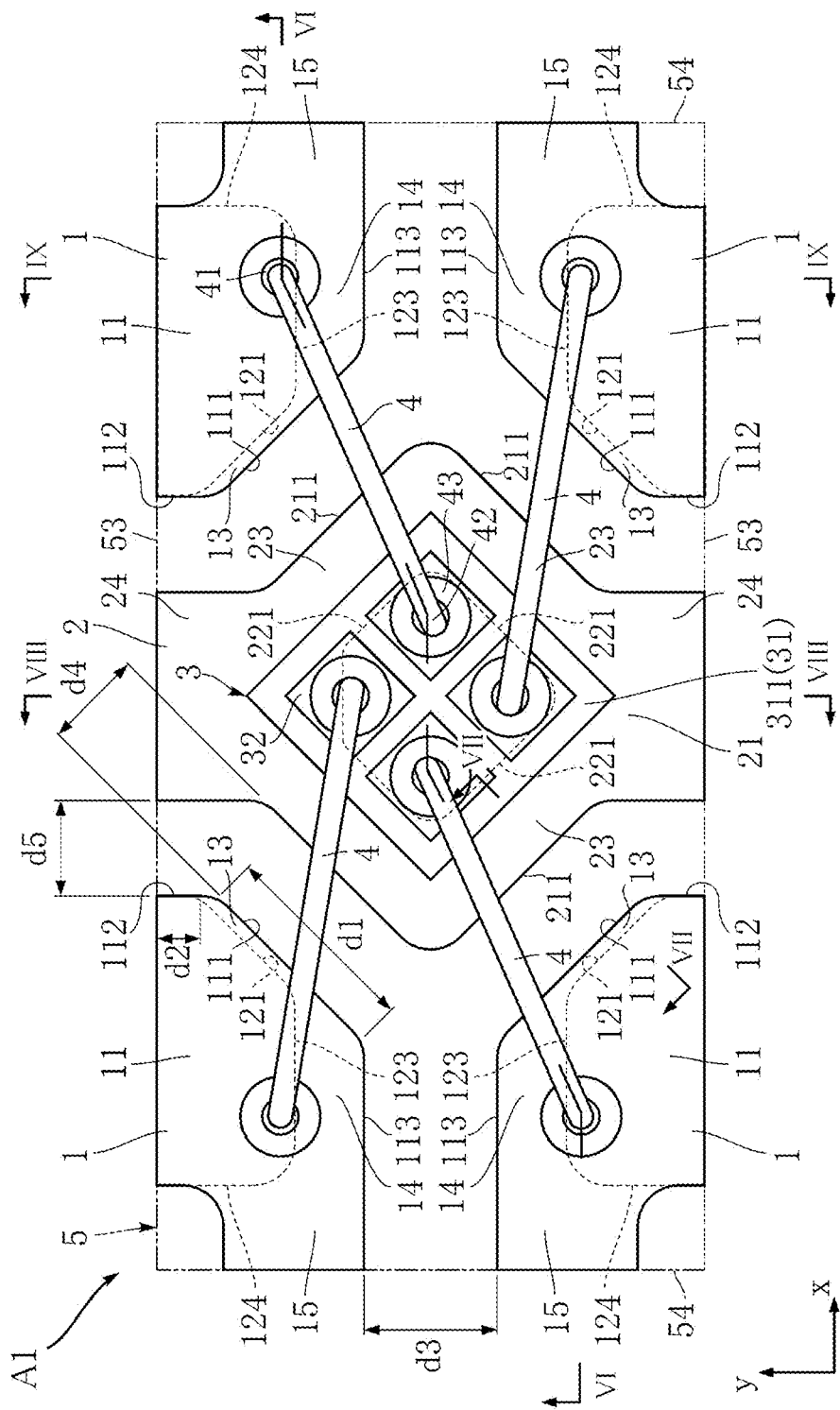
FIG. 2 is a top view of the Hall element module of FIG. 1.
Figure 3:
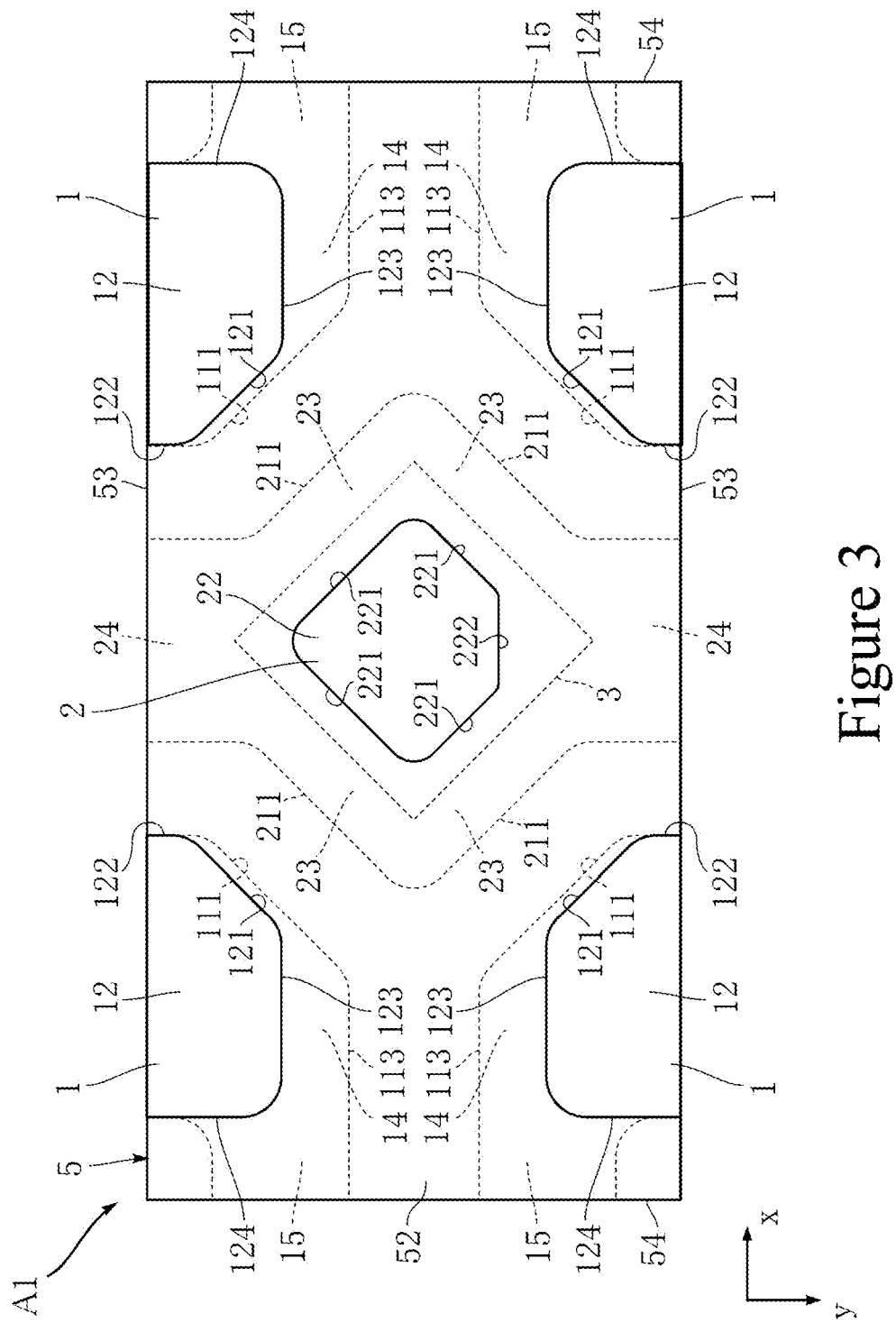
FIG. 3 is a bottom view of the Hall element module of FIG. 1.
Figure 8:
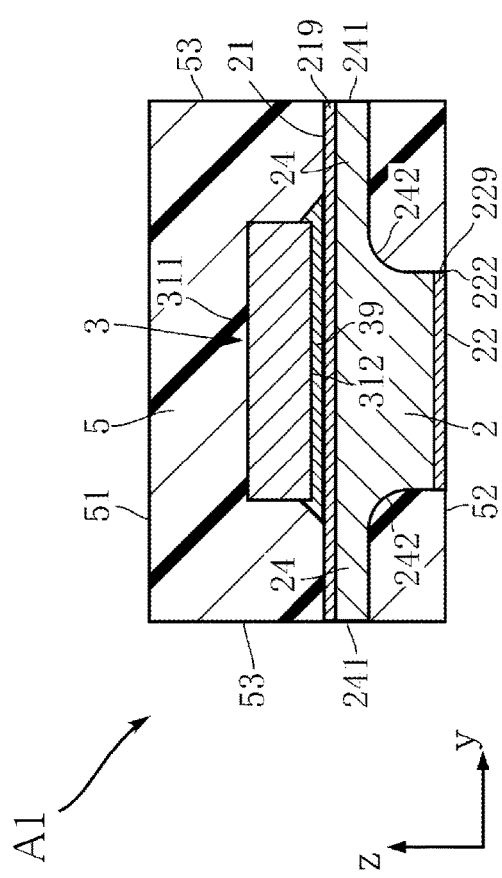
FIG. 8 is a cross-sectional view along line VIII-VIII of FIG. 2.
Figure 9:
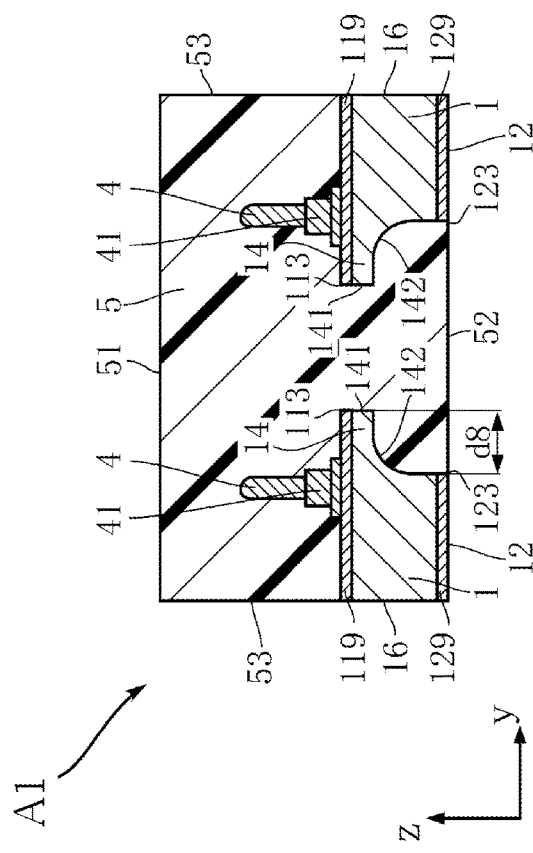
FIG. 9 is a cross-sectional view along line IX-IX of FIG. 2.
Figure 10:
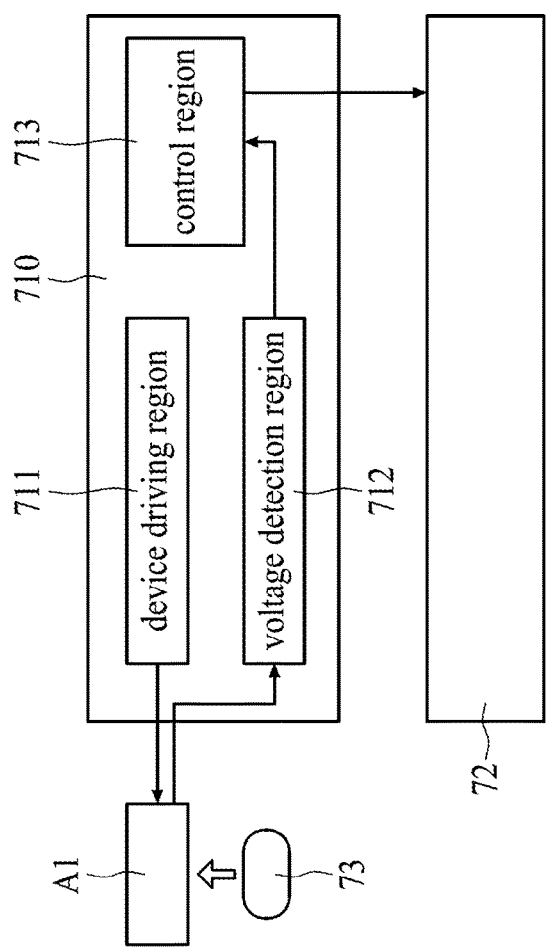
FIG. 10 is a block diagram showing a circuit applying the Hall element of FIG. 1.

FIG. 1 is a perspective view showing a Hall element module A1. FIG. 2 is a top view of the Hall element module of FIG. 2. FIG. 3 is a bottom view of the Hall element module of FIG. 1. FIG. 4 is a front view of the Hall element module of FIG. 1. FIG. 5 is a side view of the Hall element module of FIG. 1. FIG. 6 is a cross-sectional view along line VI-VI of FIG. 2. FIG. 7 is a cross-sectional view along line VII-VII of FIG. 2. FIG. 8 is a cross-sectional view along line VIII-VIII of FIG. 2. FIG. 9 is a cross-sectional view along line IX-IX of FIG. 2. FIG. 10 is a block diagram showing a circuit applying the Hall element of FIG. 1. Further, in these figures, the x direction is the first direction of the present invention, the y direction is the second direction of the present invention, and the z direction is the thickness direction of the present invention. Both the x direction and the y direction are perpendicular to the z direction. In addition, the x direction and the y direction are perpendicular to each other. Moreover, the resin package 5 is indicated by dashed lines for ease of understanding.

The Hall element module A1 is in a rectangular shape as viewed in the z direction and has four sides along the x direction and the y direction. The size of the Hall element module A1 is not particularly limited. In the present embodiment, the size in the x direction is set as 0.6~1.0 mm, the size in the y direction is set as 0.3~0.5 mm, and the size (thickness) in the z direction is set as 0.2~0.4 mm. For example, the size in the x direction is set as 0.8 mm, the size in the y direction is set as 0.4 mm, and the size (thickness) in the z direction is set as 0.23 mm.

The four terminal portions 1 and the island portion 2 are formed by appropriately cutting a lead frame made of a metal patterned by, for example, etching. The materials of the terminal portions 1 and the island portion 2 are not particularly limited, and can be Cu, for example. In the present embodiment, the terminal portions 1 and the island portion 2 are formed of the same lead frame, and has the same maximum thickness. The maximum thickness of the terminal portions 1and the island portion 2 is not particularly limited and is set as 0.06~0.1 mm in the present embodiment. The maximum thickness can be set as 0.08 mm, for example.

The four terminal portions 1 are spaced apart from the island portion 2 and the Hall element 3 as viewed in the z direction. In the present embodiment, the two terminal portions 1 and the other two terminal portions 1 are arranged separately in the x direction with the island portion 2 and the Hall element 3 interposed therebetween. In addition, at one side of the island portion 2 and the Hall element 3 in the x direction, the two wires 4 are arranged to face each other in the y direction. In the present embodiment, the four terminal portions 1 have substantially the same configuration, but may have different configurations.

The terminal portion 1 has a terminal surface 11, a terminal back surface 12, a terminal first thin wall portion 13, a terminal second thin wall portion 14, a terminal third thin wall portion 15, a terminal side exposed surface 16, a terminal inclined surface 131, a terminal first intermediate surface 132, a terminal side surface 141, a terminal second intermediate surface 142 and a terminal back surface 151.

The terminal surface 11 is a surface facing upward in the z direction. The terminal back surface 12 is a surface facing downward in the z direction. The terminal back surface 12 is exposed from the resin package 5, and is used as a mounting terminal when the Hall element module A1 is mounted on a circuit substrate or the like. In addition, in the present embodiment, a plating layer 119 including Ni, Pd, Au and the like is formed on the terminal surface 11, and a plating layer 129 including Ni, Pd, Au and the like is formed on the terminal back surface 12. Further, the plating layer 119 and the plating layer 129 may not be formed.

As shown in FIG. 2, an end edge of the terminal surface 11 includes a terminal surface inclined portion 111, a terminal surface front portion 112 and a terminal surface side portion 113. The terminal surface inclined portion 111 is opposed to the Hall element 3 as viewed in the z direction and inclined with respect to the x direction and the y direction. In the embodiment shown in the figure, the angle of the terminal surface inclined portion 111 with respect to the x direction and the y direction is 45°. The terminal surface front portion 112 is connected to the terminal surface inclined portion 111 and is along the y direction and located closest to the Hall element 3 in the x direction. The terminal surface side portion 113 is connected to the terminal surface inclined portion 111 and is along the x direction. In addition, the terminal surface inclined portion 111 may have a curved shape as a whole due to a manufacturing method such as etching.

As shown in FIG. 3, the end edge of the terminal back surface 12 includes a terminal back surface inclined portion 121, a terminal back surface front portion 122, a terminal back surface side portion 123 and a terminal back surface rear portion 124. The terminal back surface inclined portion 121 is opposed to the Hall element 3 as viewed in the z direction, and inclined with respect to the x direction and the y direction. In the example shown in the figure, the angle of the terminal back surface inclined portion 121 with respect to the x direction and the y direction is 45°, and the terminal back surface inclined portion 121 is parallel to the terminal surface inclined portion 111. The terminal back surface front portion 122 is connected to the terminal back surface inclined portion 121, and is along the y direction and located closest to the Hall element 3 in the x direction. The terminal back surface side portion 123 is connected to the terminal back surface inclined portion 121 and is along the x direction. The terminal back surface rear portion 124 is connected to the terminal back surface side portion 123, and is located at the side opposed to the terminal back surface front portion 122 in the x direction, and is along the y direction. Further, the terminal back surface inclined portion 121 may have a curved shape as a whole due to a manufacturing method such as etching.

As shown in FIG. 2, FIG. 3 and FIG. 7, the terminal surface inclined portion 111 is closer to the Hall element 3 than the terminal back surface inclined portion 121 as viewed in the z direction. A terminal first thin wall portion 13 is located between the terminal surface inclined portion 111 and the terminal back surface inclined portion 121 as viewed in the z direction, and is thinner than a distance between the terminal surface 11 and the terminal back surface 12, the distance being the maximum thickness of the terminal portion 1. The terminal inclined surface 131 is a surface that is connected to the terminal surface inclined portion 111 and is along the z direction. The size of the terminal inclined surface 131 in the z direction is smaller than the maximum thickness of the terminal portion 1, and is about ¼~½ of the maximum thickness in the present embodiment. The terminal first intermediate surface 132 is connected to the terminal inclined surface 131 and the terminal back surface inclined portion 121. The shape of the terminal first intermediate surface 132 is not particularly limited, and is a concave surface recessed inwardly in the case shown in the figure. The terminal first intermediate surface 132 can be an inclined surface, or a combination of several planes.

As shown in FIG. 1 to FIG. 3, the terminal surface front portion 112 and the terminal back surface front portion 122 coincide with each other as viewed in the z direction. Hence, no steps, inclined surfaces or the like are arranged between the terminal surface front portion 112 and the terminal back surface front portion 122.

As shown in FIG. 2, FIG. 3 and FIG. 9, the terminal surface side portion 113 is closer to the terminal portion 1 that is oppositely disposed in the y direction than the terminal back surface side portion 123. The terminal second thin wall portion 14 is located between the terminal surface side portion 113 and the terminal back surface side portion 123 as viewed in the z direction, and is thinner than the distance between the terminal surface 11 and the terminal back surface 12, the distance being the maximum thickness of the terminal portion 1. The terminal side surface 141 is a surface that is connected to the terminal surface side portion 113 and is along the z direction. The size of the terminal side surface 141 in the z direction is smaller than the maximum thickness of the terminal portion 1, and is ¼~½ of the maximum thickness in the present embodiment. The terminal second intermediate surface 142 is connected to the terminal side surface 141 and the terminal back surface side portion 123. The shape of the terminal second intermediate surface 142 is not particularly limited, and is a concave surface recessed inwardly in the case shown in the figure. The terminal second intermediate surface 142 can be an inclined surface, or a combination of several planes.

The terminal third thin wall portion 15 is connected to the terminal second thin wall portion 14, and extends opposite to the Hall element 3 in the x direction. The terminal back surface 151 is an end surface of the terminal third thin wall portion 15, and exposed from the resin package 5 in the x direction shown in FIG. 5. A size of the terminal back surface 151 in the z direction is smaller than the maximum thickness of the terminal portion 1, and is ¼~½ of the maximum thickness in the present embodiment.

The terminal side exposed surface 16 is located on the opposite side of the terminal surface side portion 113 and the terminal back surface side portion 123 in the y direction, and is toward the opposite side of the terminal side surface 141 in the present embodiment. As shown in FIG. 4, the terminal side exposed surface 16 is exposed from the resin package 5 in the y direction. In the present embodiment, a size of the terminal side exposed surface 16 in the z direction is the same as the maximum thickness of the terminal portion 1.

The island portion 2 includes an island surface 21, an island back surface 22, an island first thin wall portion 23, an island second thin wall portion 24, an island side surface 231, an island first intermediate surface 232, an island side exposed surface 241 and an island second intermediate surface 242.

The island surface 21 is a surface facing upward in the z direction. The island back surface 22 is a surface facing downward in the z direction. The island back surface 22 is exposed from the resin package 5. Further, in the present embodiment, the island surface 21 is formed with a plating layer 219 including Ni, Pd, Au, and the like, and the island back surface 22 is formed with a plating layer 229 including Ni, Pd, Au and the like. Moreover, the plating layer 219 and the plating layer 229 may not be formed.

As shown in FIG. 2, an end edge of the island surface 21 includes four island surface inclined portions 211. The island surface inclined portions 211 are opposed to the terminal surface inclined portion 111 of the terminal portion 1 as viewed in the z direction, and are inclined with respect to the x direction and the y direction. In the embodiment shown in the figure, the angle of the island surface inclined portion 211 with respect to the x direction and the y direction is 45°. In other words, in the present embodiment, the island surface inclined portion 211 is parallel to the terminal surface inclined portion 111 of the terminal portion 1. Further, the island surface inclined portion 211 may have a curved shape as a whole due to a manufacturing method such as etching. An envelope of the four island surface inclined portions 211 has a rectangular shape having diagonals along the x direction and the y direction as viewed in the z direction.

As shown in FIG. 3, the end edge of the island back surface 22 includes four island back surface inclined portions 221 and an island back surface parallel portion 222. The island back surface inclined portions 221 are opposed to the terminal back surface inclined portions 121 of the terminal portion 1 as view in the z direction, and are inclined with respect to the x direction and the y direction. In the embodiment shown in the figure, the angle of the island back surface inclined portion 221 with respect to the x direction and the y direction is 45°, and is parallel to the island surface inclined portion 211. The island back surface parallel portion 222 is located at one end in the y direction and along the x direction. An envelope of the four island back surface inclined portions 221 has a rectangular shape having diagonals along the x direction and the y direction as viewed in the z direction. Further, the island back surface inclined portion 221 may have a curved shape as a whole due to a manufacturing method such as etching.

As shown in FIG. 2, FIG. 3 and FIG. 7, the island surface inclined portion 211 is closer to the terminal portion 1 that is oppositely disposed than the island back surface inclined portion 221 as viewed in the z direction. The island first thin wall portion 23 is located between the island surface inclined portion 211 and the island back surface inclined portion 221 as viewed in the z direction, and has a thickness smaller than a distance between the island surface 21 and the island back surface 22, i.e. the maximum thickness of the island portion 2. The island side surface 231 is a surface that is connected to the island surface inclined portion 211 and is along the z direction. The size of the island side surface 231 in the z direction is smaller than the maximum thickness of the island portion 2, and is ¼~½ of the maximum thickness in the present embodiment. The island first intermediate surface 232 is connected to the island side surface 231 and the island back surface inclined portion 221. The shape of the island first intermediate surface 232 is not particularly limited, and is a concave surface recessed inwardly in the case shown in the figure. The island first intermediate surface 232 can be an inclined surface, or a combination of several planes.

As shown in FIG. 2, FIG. 3 and FIG. 8, the island second thin wall portion 24 is connected to the island first thin wall portion 23, and extends along the y direction. The island side exposed surface 241 is the end surface of the island second thin wall portion 24, and is exposed from the resin package 5 in the y direction as shown in FIG. 4 and FIG. 8. The size of the island side exposed surface 241 in the z direction is smaller than the distance between the island surface 21 and the island back surface 22, i.e. the maximum thickness of the island portion 2, and is ¼~2/1 of the maximum thickness in the present embodiment. The island second intermediate surface 242 is connected to the island side exposed surface 241 and the island back surface 22. The shape of the island second intermediate surface 242 is not particularly limited, and is a concave surface recessed inwardly in the case shown in the figure. The island second intermediate surface 242 can be an inclined surface, or a combination of several planes.

In the present embodiment, as shown in FIG. 2, a length d1 of the terminal surface inclined portion 111 is longer than a length d2 of the terminal surface front portion 112. In addition, a distance d3 between the terminal surface side portions 113 of the terminal portion 1 arranged opposite to each other is larger than a distance d4 between the terminal surface inclined portion 111 and the island surface inclined portion 211 facing each other. Further, the distance d3 is larger than a distance d5 between the terminal surface front portion 112 and the island second thin wall portion 24 facing each other. Further, in the present embodiment, the distance d3 is about 0.1 mm, and the distance d4 and the distance d5 are both about 0.07 mm. Additionally, as shown in FIG. 7, a distance d6 between the terminal surface inclined portion 111 and the terminal back surface inclined portion 121 as viewed in the z direction is smaller than a distance d7 between the island surface inclined portion 211 and the island back surface inclined portion 221 as viewed in the z direction. Further, as shown in FIG. 9, a distance d8 between the terminal surface side portion 113 and the terminal back surface side portion 123 as viewed in the z direction is larger than the distance d6 shown in FIG. 7. For example, the distance d6 is about 0.01~0.03 mm, the distance d7 is about 0.07 mm, and the distance d8 is about 0.05 mm.

The Hall element 3 includes an element body 31 and four electrode pads 32, and has a rectangular shape as viewed in the z direction. In the present embodiment, the Hall element 3 is mounted on the island surface 21 of the island portion 2 with the diagonals in the x and y directions. A length of one side of the Hall element 3 as viewed in the z direction is about 0.19 mm, for example, a length of the island back surface inclined portion 221 is about 0.14 mm, and a length of the island surface inclined portion 211 is about 0.28 mm. In the present embodiment, as viewed in the z direction, the island back surface 22 is in the Hall element 3. Further, in the cross-sectional views such as FIG. 6, the illustration of the electrode pad 32 is omitted.

The element body 31 includes a semiconductor material and is a portion at which the Hall effect occurs. The element body 31 includes an element surface 311 and an element back surface 312. The element surface 311 is a surface that faces the same side as the island surface 21 of the island portion 2, and as shown in the figure, is parallel to the island surface 21. The element back surface 312 faces the opposite side of the element surface 311, and is connected to the island surface 21 through a bonding material 39 such as an insulating bonding material, a conductive bonding material or the like. In the present embodiment, an Ag paste is selected as the bonding material 39. The four electrode pads 32 are formed on the element surface 311, and include two electrode pads 32 for inputting a driving current to the Hall element 3 and two electrode pads 32 for outputting an output voltage (Hall voltage).

The four terminal portions 1 are electrically connected to the Hall element 3 by the four wires 4. The wires 4 are respectively bonded to the electrode pads 32 of the Hall element 3 and the terminal surface 11 of the terminal portion 1. The wire 4 includes Ag, for example.

As shown in FIG. 2 and FIG. 6, the wire 4 includes a first bonding portion 41 and a second bonding portion 42. In the present embodiment, the first bonding portion 41 is a portion of the wire 4 that is bonded to the terminal surface 11 of the terminal portion 1. The second bonding portion 42 is a portion of the wire 4 that is bonded to the electrode pad 32 of the Hall element 3. Further, in the present embodiment, a bump portion 43 interposed between the second bonding portion 42 and the electrode pad 32 is provided. The bump portion 43 is formed by partially melting the material for the wire 4 and attaching to the electrode pad 32 in a form of a ball bump, before the second bonding portion 42 is formed. However, this configuration is an exemplary configuration of the wire 4, and the wire 4 can be formed in various configurations. In the present embodiment, as shown in FIG. 2 and FIG. 9, the first bonding portion 41 intersects the terminal back surface side portion 123 as viewed in the z direction, and overlaps both of the terminal back surface 12 and the terminal second thin wall portion 14.

The resin package 5 covers a portion of each of the four terminal portions 1, a portion of the island portion 2, the Hall element 3, and the four wires 4. The resin package 5 includes insulating resin, such as epoxy resin mixed with a filler. As shown in FIG. 1 to FIG. 9, the resin package 5 includes a resin surface 51, a resin back surface 52, a pair of resin first side surfaces 53 and a pair of resin second side surfaces 54. The resin package 5 is in a rectangular shape with sides along the x direction and the y direction as viewed in the z direction.

The resin surface 51 is a surface of the resin package 5 that faces the same direction as the terminal surface 11 and the island surface 21 in the z direction. The resin back surface 52 is a surface that faces the opposite side of the resin surface 51 in the z direction. The pair of resin first side surfaces 53 are along the z direction and the x direction, and are opposite to each other in the y direction. The pair of resin second side surfaces 54 are along the z direction and the y direction, and are opposite to each other in the x direction.

In the present embodiment, the resin back surface 52 is coplanar with the terminal back surface 12 and the island back surface 22. In addition, the resin first side surface 53 is coplanar with the terminal side exposed surface 16 and the island side exposed surface 241. In addition, the resin second side surface 54 and the terminal back surface 151 are coplanar.

Then, an example of a circuit to which the Hall element module A1 is applied is described based on FIG. 10. FIG. 10 is a block diagram of a circuit to which the Hall element module A1 is applied.

As shown in FIG. 10, the circuit includes the Hall element module A1, an integrated circuit 710 and a control target 72. Examples of the control target 72 include a light source of a cellular phone display, a DC (Direct Current) motor, and the like. The integrated circuit 710 includes a device driving region 711, a voltage detection region 712, and a control region 713. The device driving region 711 is a region where a Hall current flows to the Hall element 3 of the Hall element module A1. The voltage detection region 712 is a region for detecting the electromotive force (Hall voltage) appearing in the Hall element 3 by the Hall effect. The control region 713 is a region that controls the operation of the control target 72. At present, when the magnet 73 approaches the Hall element module A1, the magnetic flux density changes, and electromotive force appears in the Hall element 3 by the Hall effect. This electromotive force is detected by the voltage detection region 712. The voltage detection region 712 transmits its detection result to the control region 713. The control region 713 controls (activates or inactivates, etc.) the operation of the control target 72 based on the transmitted detection result.

Then, referring to FIG. 11 to FIG. 16, an example of a method for fabricating the Hall element module A1 is illustrated.

Figure 11:
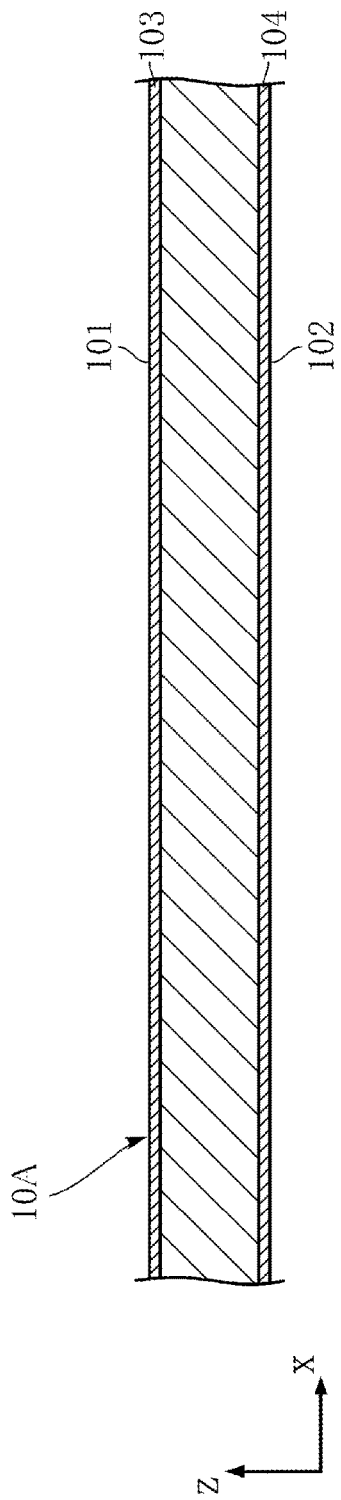
FIG. 11 is a cross-sectional view showing a method for fabricating the Hall element module of FIG. 1 according to an embodiment of the present invention.

First, as shown in FIG. 11, a frame material 10A is prepared. The frame material 10A is formed by forming the plating layer 103 and the plating layer 104 such as Ni, Pd, Au and the like on both surfaces of a base material containing, for example, Cu. The frame material 10A has a face 101 and a back face 102 that are opposite to each other in the z direction.

Figure 12:
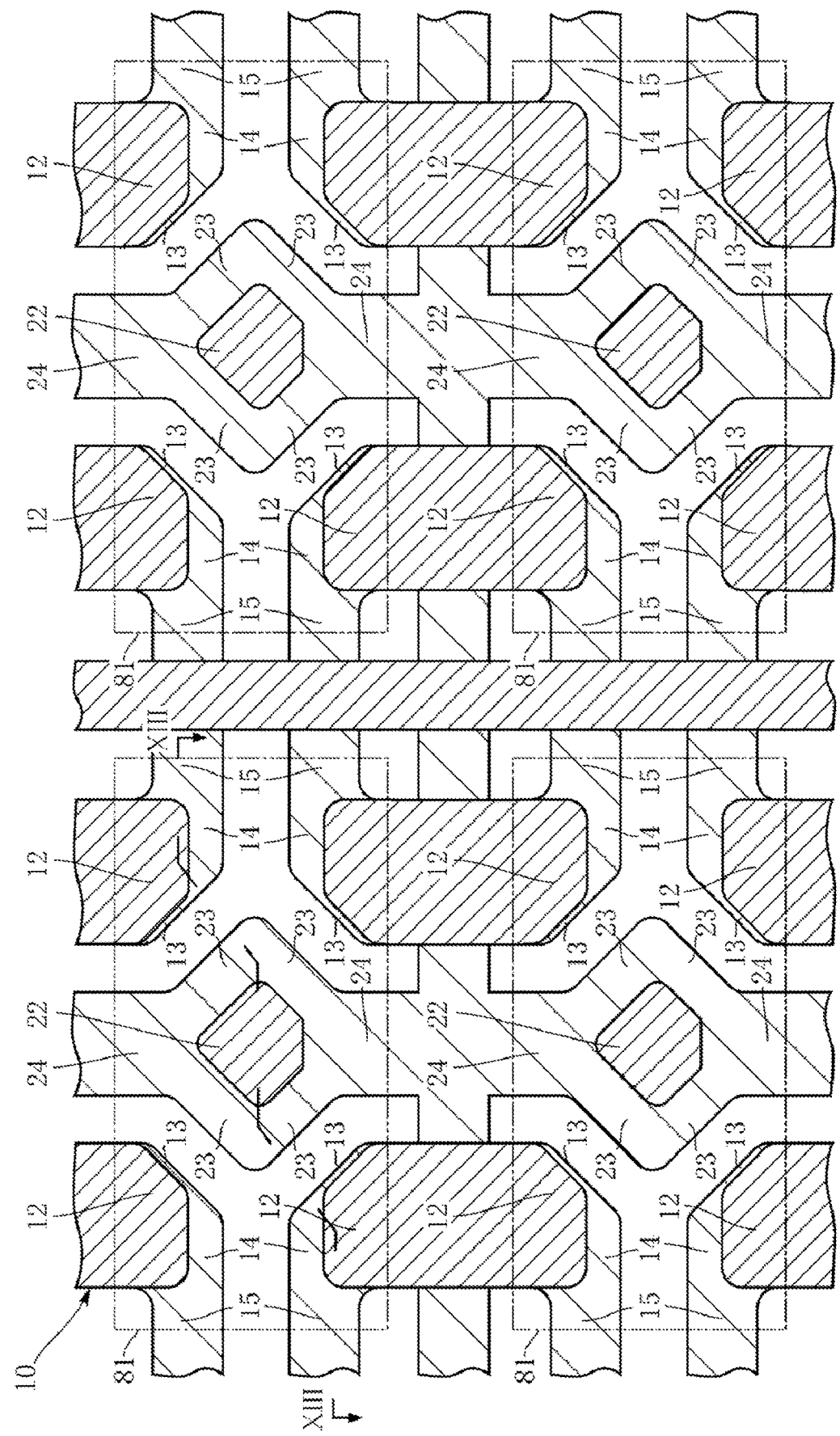
FIG. 12 is a cross-sectional view showing a method for fabricating the Hall element module of FIG. 1 according to an embodiment of the present invention.
Figure 13:
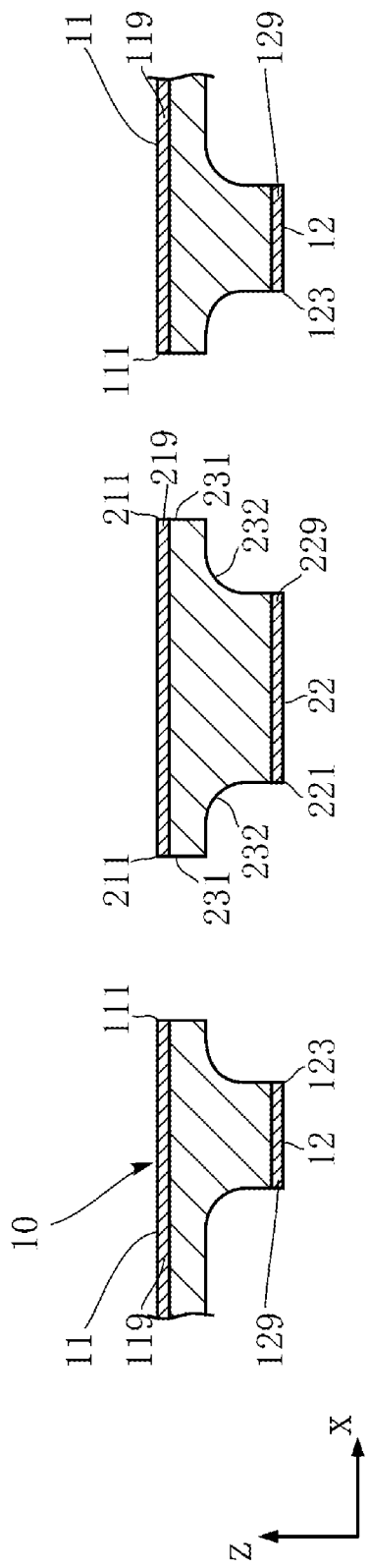
FIG. 13 is a cross-sectional view along line XIII-XIII of FIG. 12.

Then, a lead frame 10 is formed by patterning the frame material 10A as shown in FIG. 12 and FIG. 13. The lead frame 10 is formed by properly connecting the portions to be the terminal portion 1 and the island portion 2 that are included in the Hall element module A1. In the subsequent cutting step, cutting is performed along the cutting line 81, such that terminal portions 1 and island portions 2 for forming several Hall element modules A1 are obtained from the lead frame 10. Therefore, as shown in the figure, the lead frame 10 includes the terminal surface 11, the terminal back surface 12, the element body 31, the terminal second thin wall portion 14, the terminal third thin wall portion 15, the island surface 21, the island back surface 22, the island first thin wall portion 23 and the island second thin wall portion 24 of the terminal portions 1 or the island portions 2.

Figure 14:
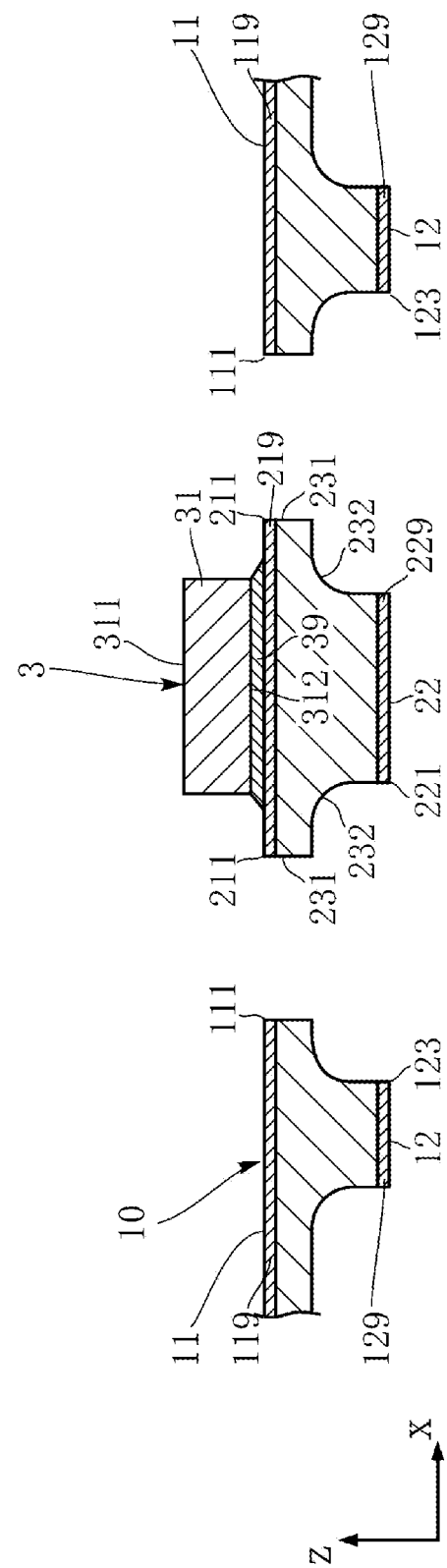
FIG. 14 is a cross-sectional view showing a method for fabricating the Hall element module of FIG. 1 according to an embodiment of the present invention.

Then, the Hall element 3 is mounted as shown in FIG. 14. This step is performed by bonding the element back surface 312 of the element body 31 of the Hall element 3 to the island surface 21 of the island portion 2 using a bonding material such as Ag paste, for example.

Figure 15:
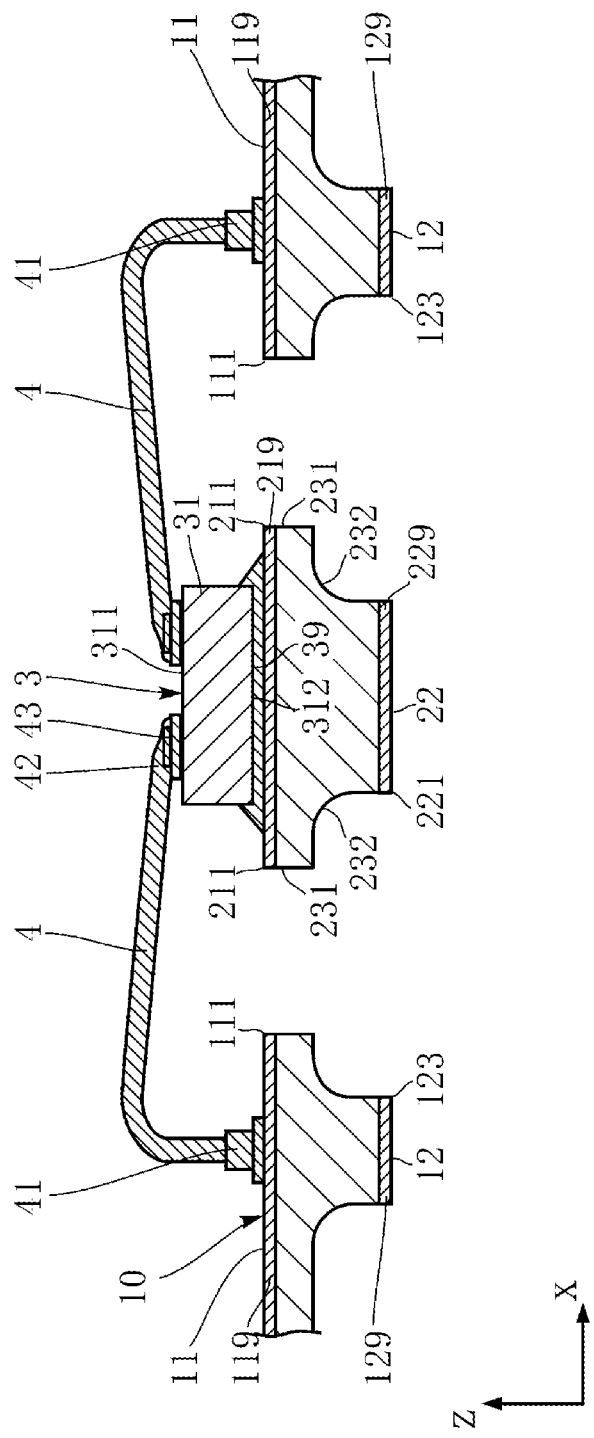
FIG. 15 is a cross-sectional view showing a method for fabricating the Hall element module of FIG. 1 according to an embodiment of the present invention.

Then, the wire 4 is bonded as shown in FIG. 15. The bonding of the wire 4 is performed by using a wiring material including Au, for example. In the present embodiment, first, an end of the wiring material is melted and attached to the electrode pad 32 of the Hall element 3. As a result, a bump portion 43 is formed on the electrode pad 32. Then, one end of the wiring material is melted and attached to the terminal surface 11 of the terminal portion 1. As a result, a first bonding portion 41 is formed. Subsequently, another portion of the wiring material is bonded to the bump portion 43 on the electrode pad 32 by ultrasonic or the like. As a result, a second bonding portion 42 is formed.

Figure 16:
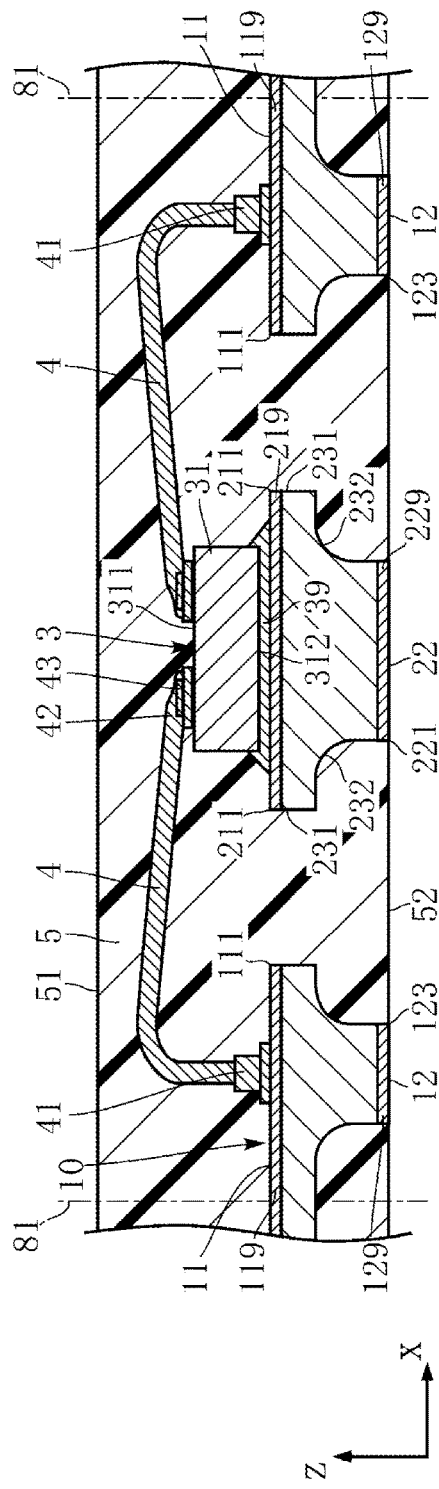
FIG. 16 is a cross-sectional view showing a method for fabricating the Hall element module of FIG. 1 according to an embodiment of the present invention.

Then, a resin package 5 is formed as shown in FIG. 16. The resin package 5 shown in the figure is integrally formed across a region for forming Hall element modules A1. Then, the lead frame 10 and the resin package 5 are cut along the cutting line 81. As a result, several Hall element modules A1 shown in FIG. 1 to FIG. 9 are obtained.

Next, the function and effect of the Hall element module A1 will be described.

According to the present embodiment, as shown in FIG. 3, the terminal back surface inclined portion 121 is formed on the terminal back surface 12 of the terminal portion 1. The terminal back surface inclined portion 121 is opposed to the Hall element 3 as viewed in the z direction, and is inclined with respect to the x direction and the y direction. Thus, the center position of the terminal portion 1 can be made close to the Hall element 3, and the shortest distance between the terminal back surface 12 and the Hall element 3 as viewed in the z direction can be prevented from being improperly reduced. Hence, the miniaturization of the Hall element module A1 can be achieved.

In addition, as shown in FIG. 2, a terminal surface inclined portion 111 is formed on the terminal surface 11 of the terminal portion 1. The terminal surface inclined portion 111 is opposed to the Hall element 3 in the z direction, and is inclined with respect to the x direction and the y direction. Thus, the center position of the terminal portion 1 can be made close to the Hall element 3, and the shortest distance between the terminal surface 11 and the Hall element 3 as viewed in the z direction can be prevented from being improperly reduced. Hence, the miniaturization of the Hall element module A1 can be achieved.

In addition, the terminal surface inclined portion 111 is closer to the Hall element 3 than the terminal back surface inclined portion 121, and the terminal portion 1 includes a terminal first thin wall portion 13. The terminal first thin wall portion 13 has a lower surface covered by the resin package 5 in the z direction. As a result, the terminal portion 1 can be prevented from falling off in the z direction from the resin package 5.

The terminal surface inclined portion 111 is parallel to the terminal back surface inclined portion 121, so as to form the terminal first thin wall portion 13 with an even width. This is preferable in terms of preventing the terminal portion 1 from falling off from the resin package 5.

The length d1 of the terminal surface inclined portion 111 is longer than the length d2 of the terminal surface front portion 112. This is appropriate for preventing the distance between the terminal surface 11 and the Hall element 3 (the island portion 2) from being improperly reduced and for reducing the terminal portion 1 and the size of the Hall element module A1 in the y direction. In addition, in the present embodiment, the length of the terminal back surface inclined portion 121 is longer than the length of the terminal back surface front portion 122, and this is preferable for miniaturization of the Hall element module A1.

In the present embodiment, the terminal surface front portion 112 and the terminal back surface front portion 122 coincide with each other as viewed in the z direction. As a result, the terminal portion 1 and the island portion 2 can be prevented from being too close to each other.

The terminal portion 1 includes the terminal second thin wall portion 14 such that the terminal portion 1 can be further prevented from falling off from the resin package 5. The terminal portion 1 includes the terminal third thin wall portion 15, which is preferable in terms of preventing the terminal portion 1 from falling off from the resin package 5.

The island back surface 22 of the island portion 2 includes the island back surface inclined portion 221, such that the center of the terminal part 1 can be made close to the center of the island part 2, and the shortest distance between the terminal back surface 12 and the island back surface 22 can be prevented from being improperly reduced. In addition, the island surface 21 includes the island surface inclined portion 211, such that the center of the terminal portion 1 can be made close to the center of the island portion 2, and the shortest distance between the terminal surface 11 and the island surface 21 can be prevented from being improperly reduced.

By arranging the island first thin wall portion 23 on the island portion 2, the island portion 2 can be prevented from falling off from the resin package 5. In addition, the island portion 2 includes the island second thin wall portion 24, which is preferable in terms of preventing the island portion 2 from falling off from the resin package 5.

As shown in FIG. 7 and FIG. 9, a protruding distance, i.e. a distance d6, of the terminal first thin wall portion 13 is smaller than a protruding distance, i.e. a distance d7, of the island first thin wall portion 23 and a protruding distance, i.e. a distance d8, of the terminal second thin wall portion 14. This is preferable for preventing the terminal portion 1 from falling off from the resin package 5 by the terminal first thin wall portion 13, and for preventing the shortest distance between the terminal portion 1 and the island portion 2 from being improperly reduced.

As shown in FIG. 2, the distance d3 is longer than the distance d4 and the distance d5. The distance d3 is a distance between the terminal surface side portions 113. The terminal surface side portion 113 is separated from the island portion 2 and the Hall element 3. Even if the distance d3 is relatively long, the miniaturization of the Hall element module A1 is hardly impaired. By relatively increasing the distance d3, the effect of promoting the transfer or wraparound of the resin material at the time of forming the resin package 5 can be expected. On the other hand, the larger the distance d4 and the distance d5 are, the more the size of the Hall element module A1 is hindered. In the present embodiment, by relatively decreasing the distance d4 and the distance d5, the Hall element module A1 can be miniaturized. Further, empirically, the minimum dimension of the distance d4 and the distance d5 is about the maximum thickness of the terminal portion 1 and the island portion 2. In other words, the configuration in which the distance d3 is 0.1 mm in the case where the thickness of the terminal portion 1 and the island portion 2 is 0.08 mm indicates an intention to, for example, promote the transfer or wraparound of the resin material.

The Hall element 3 has a configuration in which the diagonals are along the x direction and the y direction. This prevents the Hall element 3 from being interfered with the terminal portion 1 including the terminal surface inclined portion 111 and the terminal back surface inclined portion 121 when the Hall element 3 is mounted on the island portion 2 including the island surface inclined portion 211 and the island back surface parallel portion 222, and is preferable for miniaturization of the Hall element module A1.

As shown in FIG. 2 and FIG. 9, the first bonding portion 41 intersects the terminal back surface side portion 123 as viewed in the z direction, and overlaps both of the terminal back surface 12 and the terminal second thin wall portion 14. Thus, when the wires 4 are bonded, the force applied by the capillary for bonding or the like can be properly received by the portion of the terminal portion 1 overlapping the terminal back surface 12 as viewed in the z direction, such that the bonding can be prevented from becoming unstable. On the other hand, a portion of the first bonding portion 41 overlaps the terminal second thin wall portion 14, such that the first bonding portion 41 is arranged on the center side in the y direction. As a result, the situation that the resin package 5 is partially thinned due to the first bonding portion 41 being too close to the resin first side surface 53 of the resin package 5 or the wire 4 is mistakenly cut in the cutting process can be prevented.

FIG. 17 to FIG. 34 show variations and other embodiment of the present invention. Further, in these figures, the same or similar elements as those of the Hall element module A1 are indicated by the same symbols as those of the Hall element module A1.

Figure 17:
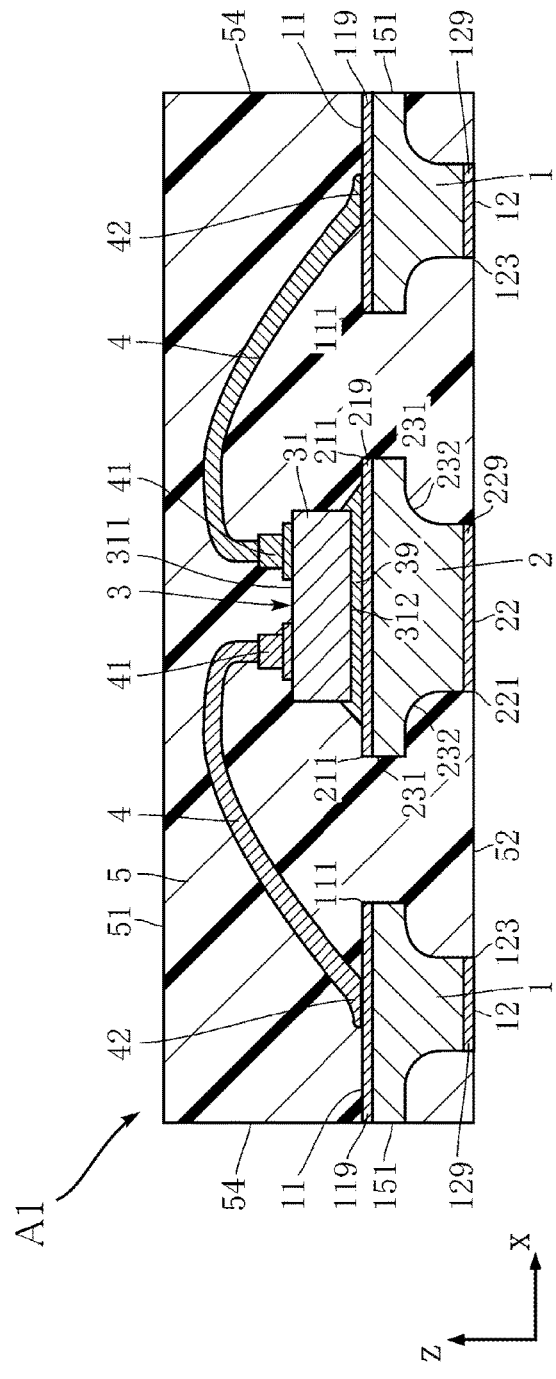
FIG. 17 is a cross-sectional view along line VI-VI of FIG. 2 showing a variation of the Hall element module of FIG. 1.

FIG. 17 is a cross-sectional view showing a variation of the Hall element module A1. In the variation, the configuration of the wire 4 is different from that of the Hall element module A1. In this variation, the wire 4 is used for bonding the first bonding portion 41 to the electrode pad 32 of the Hall element 3, and for bonding the second bonding portion 42 to the terminal surface 11 of the terminal portion 1. The miniaturization of the Hall element module A1 can be achieved by this variation. Further, although the example shown in FIG. 6 is advantageous in reducing the size of the Hall element module A1 in the z direction, the arrangement of the first bonding portion 41 and the second bonding portion 42 can be appropriately selected, and the same applies to the following embodiments.

Second Embodiment

Figure 18:
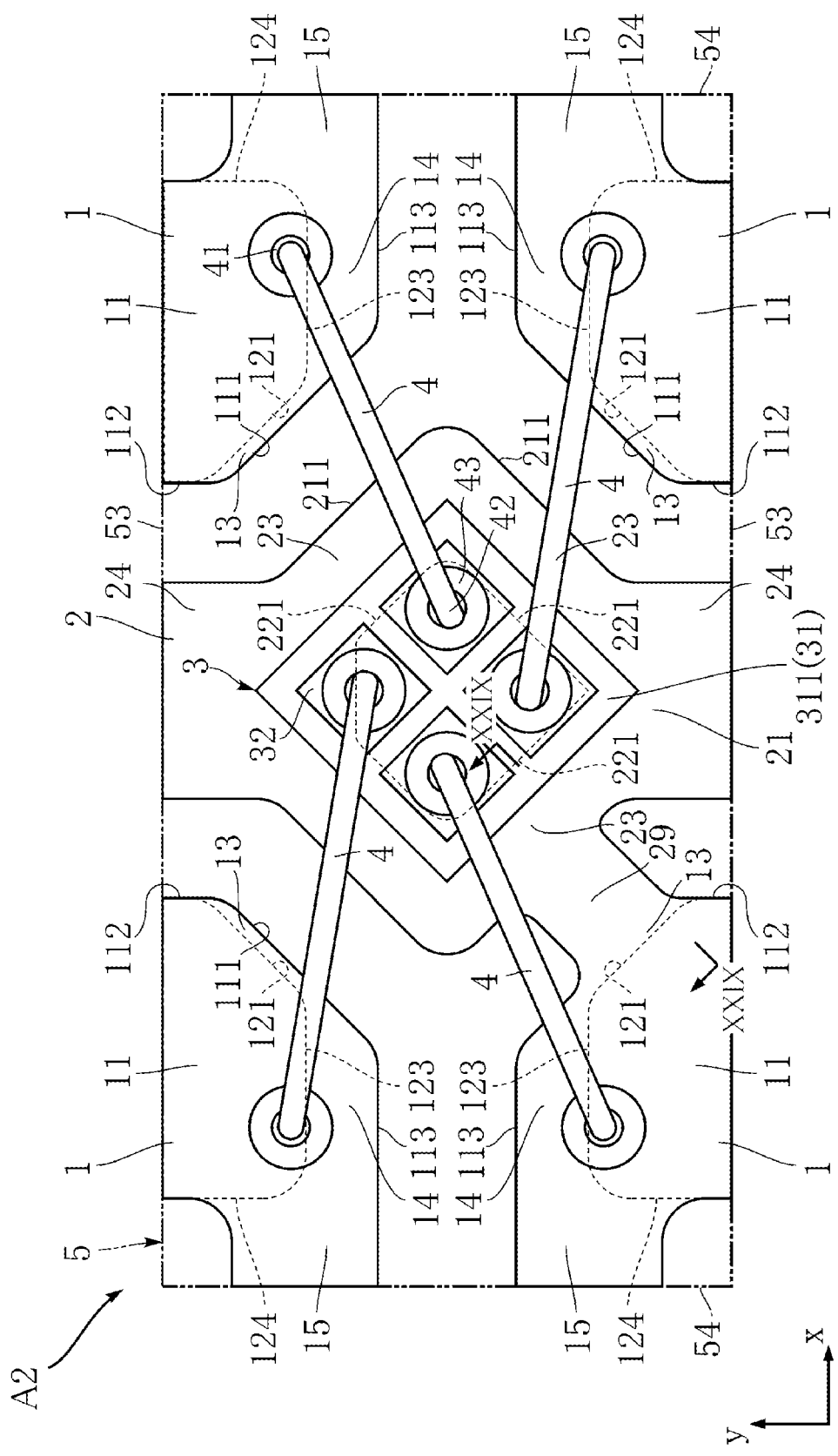
FIG. 18 is a top view of a Hall element module according to the second embodiment of the present invention.
Figure 19:
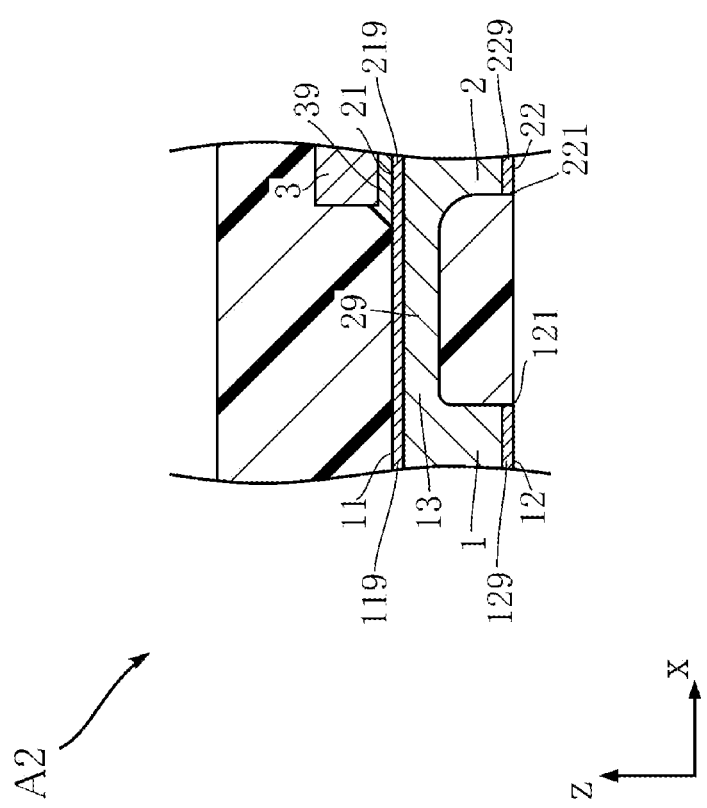
FIG. 19 is a cross-sectional view along line XXIX-XXIX of FIG. 18.

FIG. 18 and FIG. 19 show a Hall element module A2 according to the present invention. The Hall element module A2 is different from the Hall element module A1 in that the Hall element module A2 includes a connecting thin wall portion 29.

The connecting thin wall portion 29 connects one terminal portion 1 to the island portion 2. In other words, the terminal portion 1 and the island portion 2 in the lower left part of FIG. 18 are formed integrally with the connecting thin wall portion 29. More specifically, the connecting thin wall portion 29 connects the terminal first thin wall portion 13 of the terminal portion 1 to the island first thin wall portion 23 of the island portion 2. The size (thickness) of the connecting thin wall portion 29 in the z direction is smaller than the maximum thickness of the terminal portion 1 and the island portion 2. The connecting thin wall portion 29 is covered by the resin package 5 in a lower part in the z direction.

The miniaturization of the Hall element module A2 can be achieved by the present embodiment. In addition, by using the connecting thin wall portion 29 for connecting the terminal portion 1 and the island portion 2, high rigidity of the island portion 2 can be achieved during and after the manufacturing.

Third Embodiment

Figure 20:
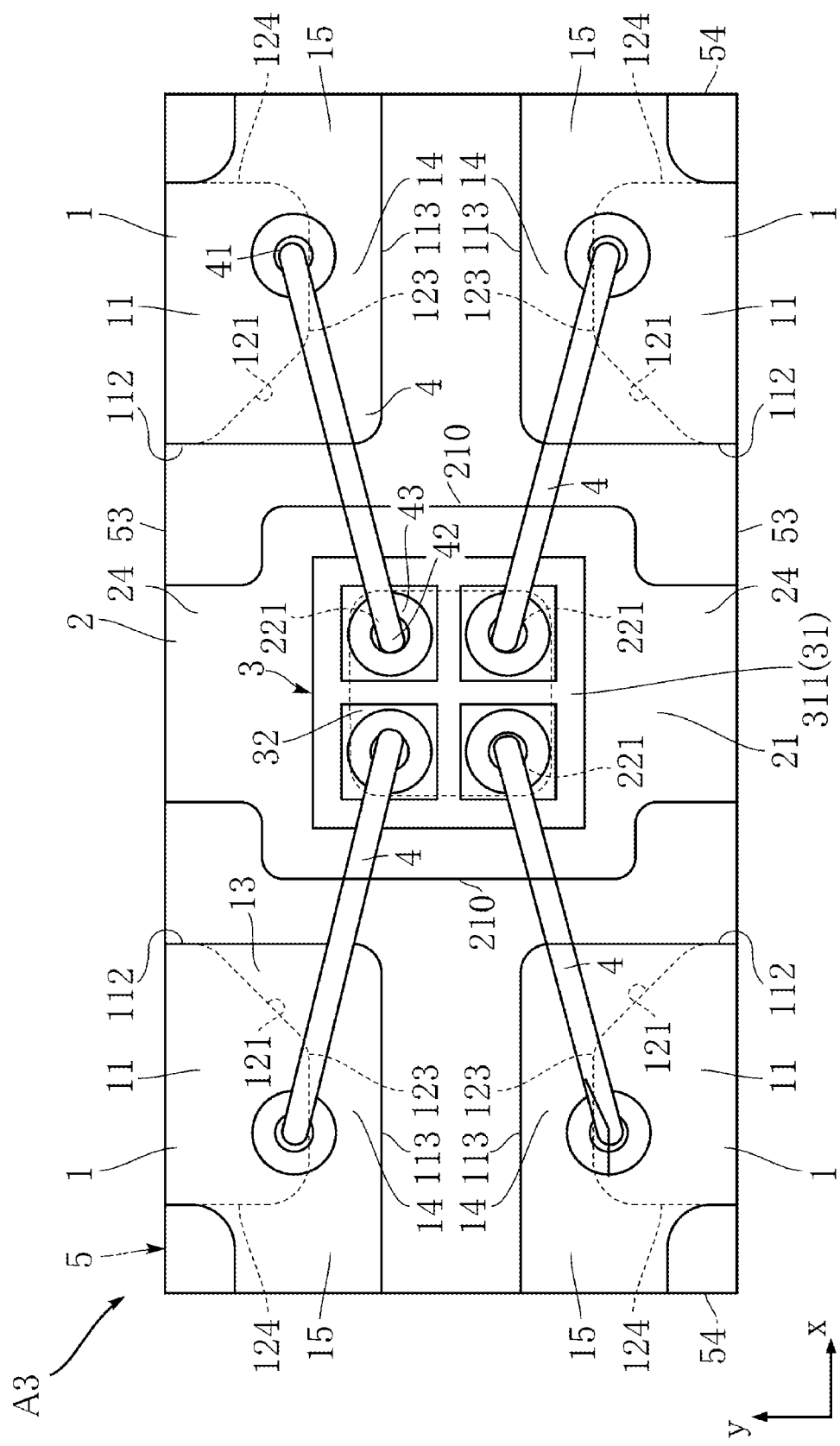
FIG. 20 is a top view of a Hall element module according to the third embodiment of the present invention.

FIG. 20 shows a Hall element module A3 according to the third embodiment of the present invention. The Hall element module A3 is different from the Hall element module A1 in the shapes of the terminal portion 1 and the island portion 2.

In the present embodiment, an end edge of the terminal portion 1 has no terminal surface inclined portion 111. In other words, the terminal surface front portion 112 is connected to the terminal surface side portion 113.

In the present embodiment, an end edge of an island surface 21 of the island portion 2 includes a pair of island surface straight portions 210. The pair of island surface straight portions 210 are respectively along the y direction and separated from each other in the x direction.

In the present embodiment, the Hall element 3 is mounted on the island surface 21 with four sides along the x direction and the y direction.

The miniaturization of the Hall element module A3 is achieved by forming a terminal back surface inclined portion 121 on an end edge of the terminal back surface 12 of the terminal portion 1 according to the present embodiment.

Fourth Embodiment

Figure 21:
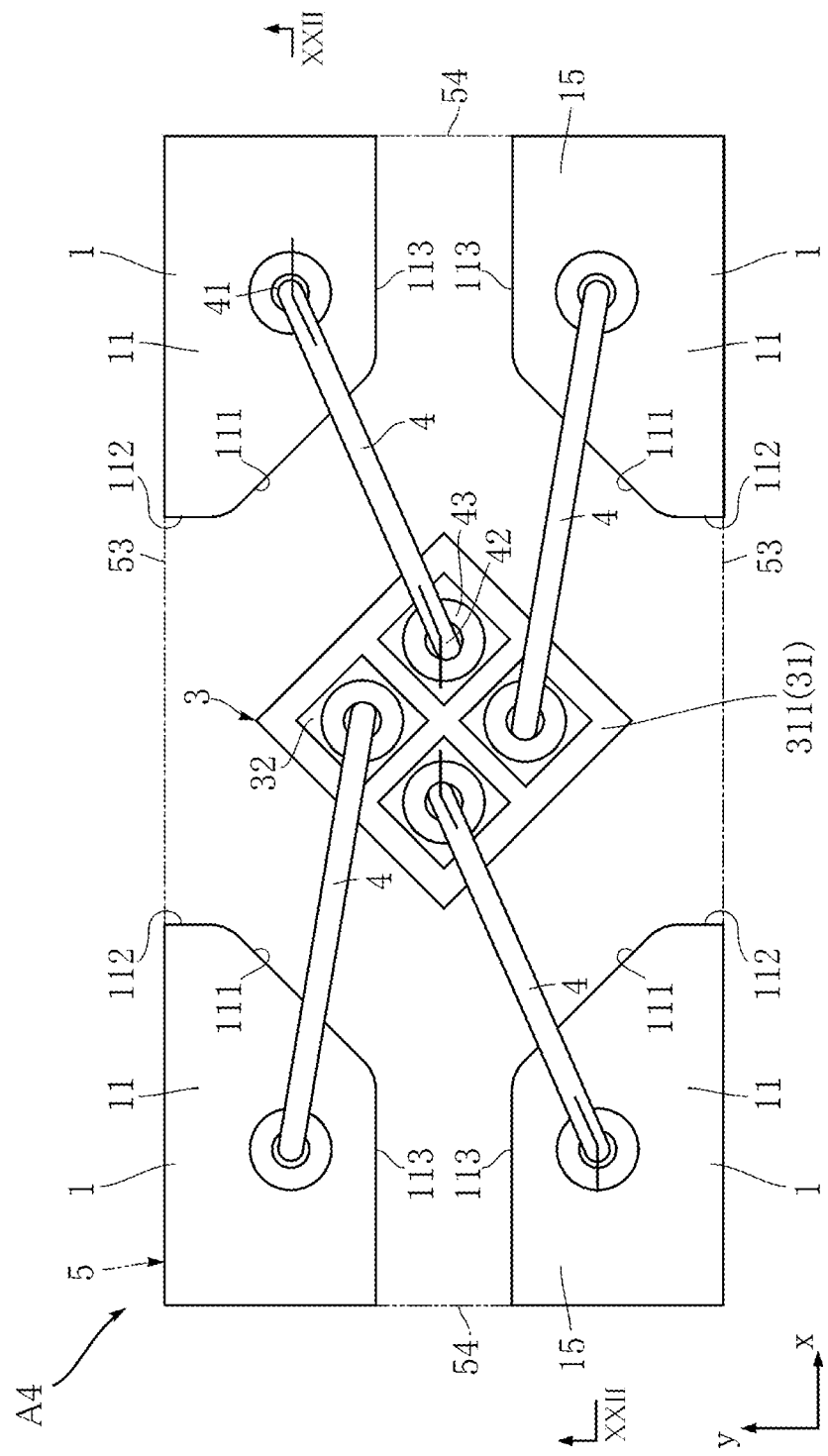
FIG. 21 is a top view of a Hall element module according to the fourth embodiment of the present invention.
Figure 22:
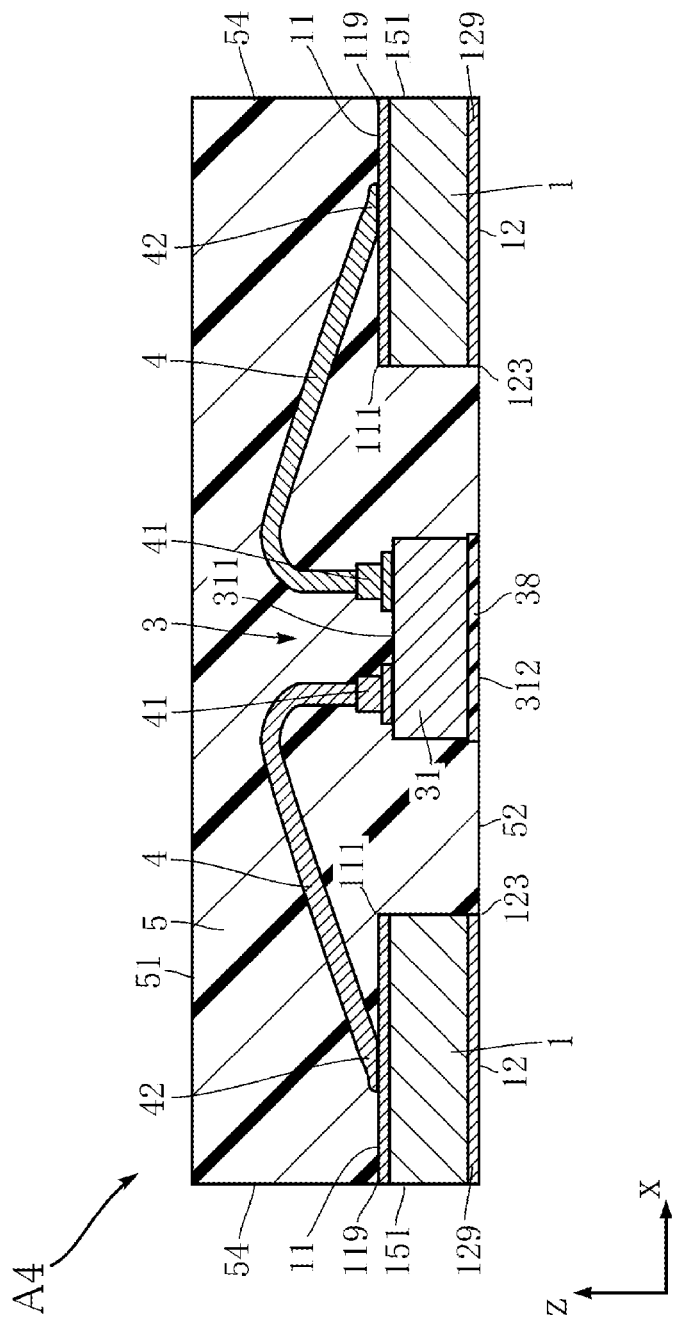
FIG. 22 is a cross-sectional view along line XXII-XXII of FIG. 21.

FIG. 21 and FIG. 22 show a Hall element module A4 according to the fourth embodiment of the present invention. The Hall element module A4 is different from the Hall element module A1 in that the Hall element module A4 includes no island portion 2.

An element back surface 312 of the Hall element 3 is exposed from a resin back surface 52 of a resin package 5 in a lower part in the z direction. In the embodiment shown in the figure, an insulating layer 38 is formed on an element body 31, and the insulating layer 38 constitutes the element back surface 312.

The terminal portion 1 has a shape in which the terminal surface 11 and the terminal back surface 12 coincide with each other as viewed in the z direction. In other words, an end edge of the terminal surface 11 includes a terminal surface inclined portion 111, an end edge of the terminal back surface 12 includes a terminal back surface inclined portion 121, but no terminal first thin wall portion 13, terminal second thin wall portion 14 and terminal third thin wall portion 15 are formed.

The Hall element module A4 is manufactured by mounting a plurality of terminal portions 1 and a Hall element 3 on a non-illustrated substrate, for example, and forming a resin package 5 after bonding wires 4. Then, the substrate is stripped off from the terminal portion 1, the Hall element 3 and the resin package 5, such that the Hall element module A4 is obtained.

The miniaturization of the Hall element module A4 can be achieved by the present embodiment.

Fifth Embodiment

FIG. 23 to FIG. 26 show a Hall element module A5 according to the fifth embodiment of the present invention. The Hall element module A5 is different from the Hall element module A1 in shapes of the terminal portion 1 and the island portion 2.

Figure 23:
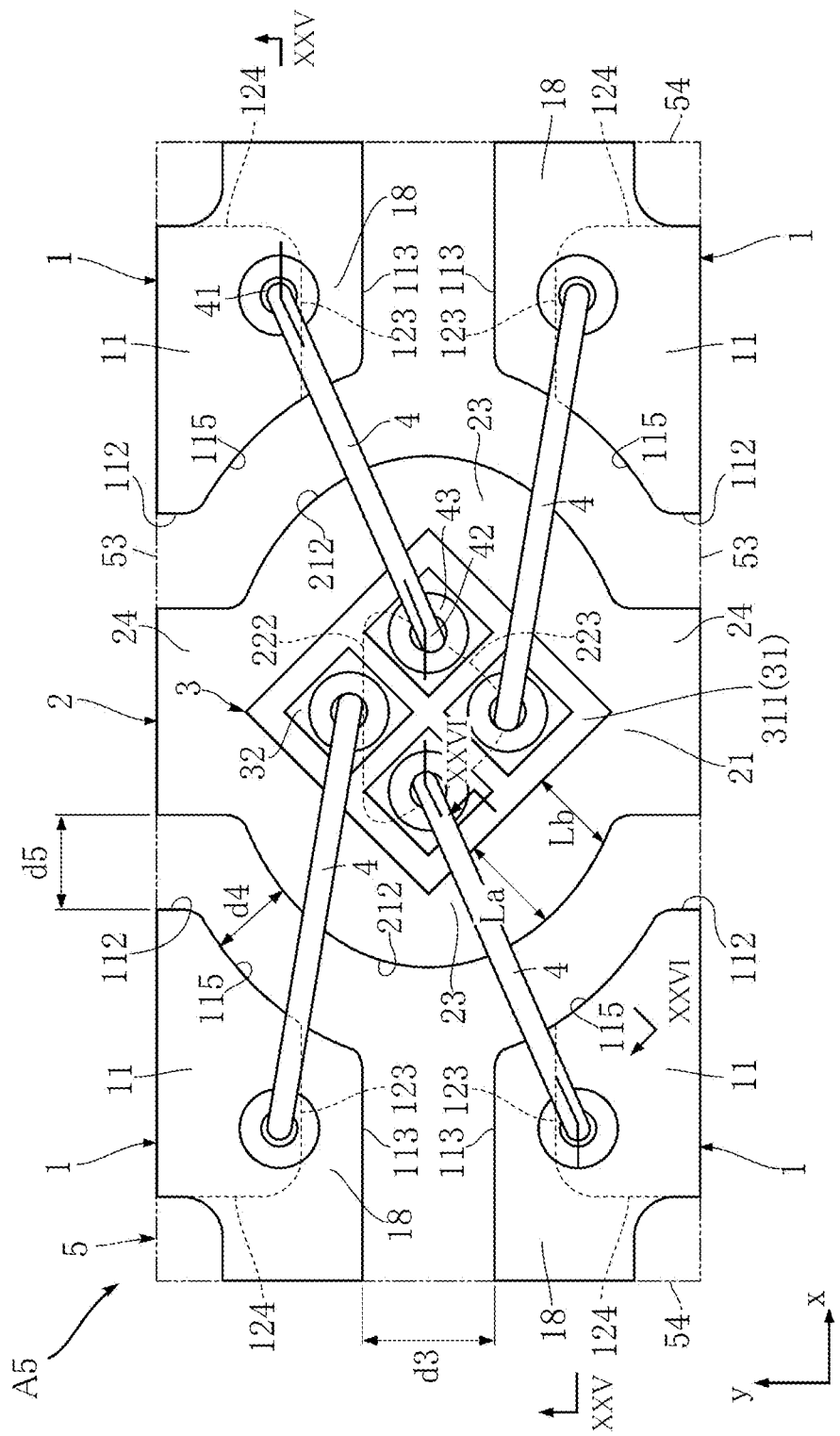
FIG. 23 is a top view of a Hall element module according to the fifth embodiment of the present invention.

As shown in FIG. 23, an end edge of an island surface 21 of the island portion 2 includes an island surface protruding portion 212 opposed to the terminal portion 1 as viewed in the z direction. The island surface protruding portion 212 is formed in a shape that protrudes toward the respective terminal portions 1. In the present embodiment, the island surface protruding portion 212 is formed of a curved line. Further, in the present embodiment, the shape of the island surface 21 other than the island second thin wall portion 24 has an elliptic shape with an axis in the x direction. In addition, the island surface 21 other than the island second thin wall portion 24 may have a circular shape.

Further, as shown in FIG. 23, as viewed in the z direction, the distance between one side of the Hall element 3 in the direction orthogonal to the one side of the Hall element 3 and the edge of the island surface protruding portion 212 has at least two lengths (the length La and the Length Lb shown in FIG. 23). In the present embodiment, the length La is set to be longer than the length Lb.

Figure 24:
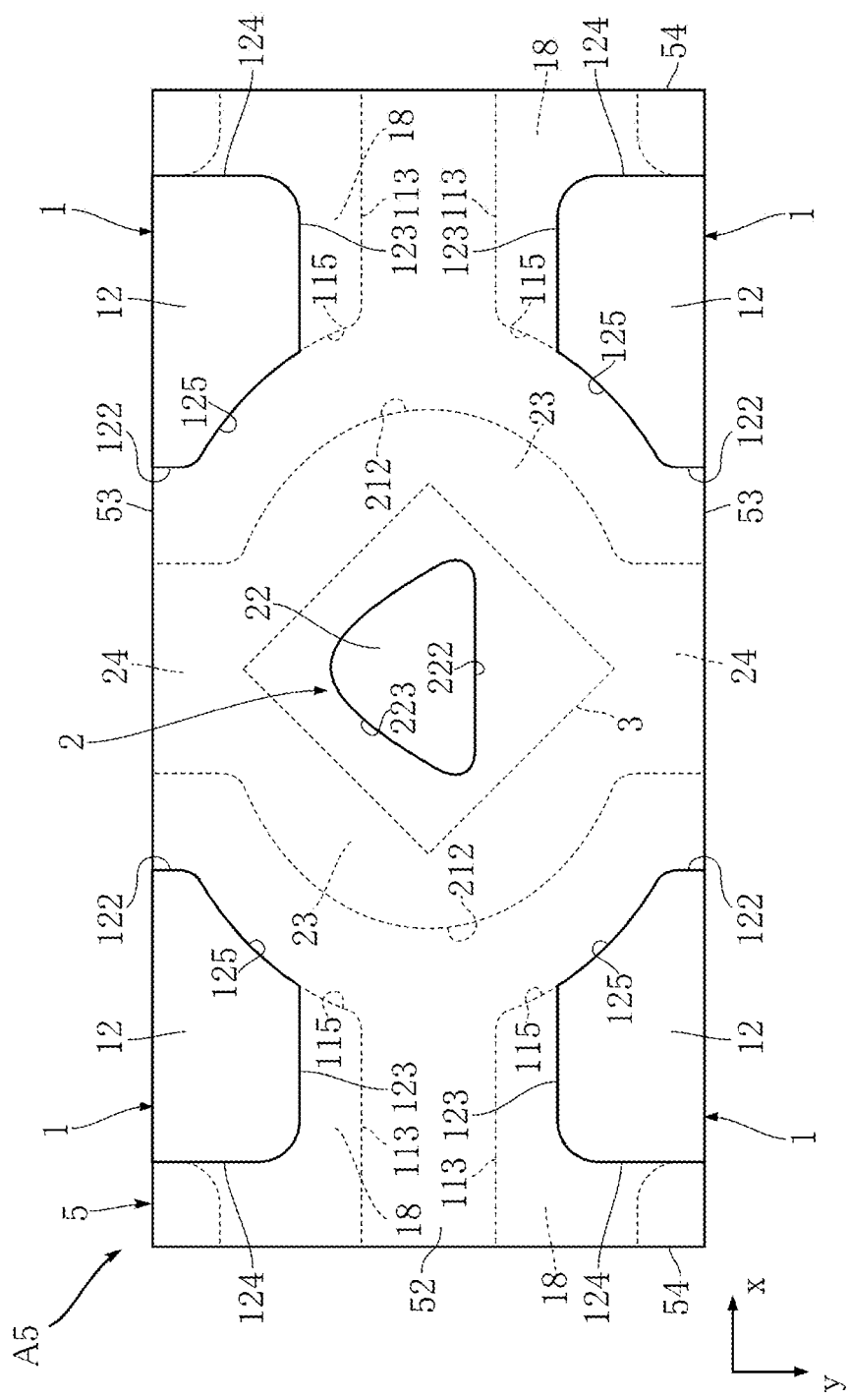
FIG. 24 is a top view of the Hall element module of FIG. 23.

As shown in FIG. 24, the end edge of the island back surface 22 of the island portion 2 includes an island back surface parallel portion 222 and an island back surface curve portion 223. The island back surface parallel portion 222 is parallel to the x direction similarly to the Hall element module A1. The island back surface curve portion 223 is a continuous curve portion, and has two ends connected to the island back surface parallel portion 222. In addition, the shape of the island back surface 22 can be the same as that of the Hall element module A1.

Figure 25:
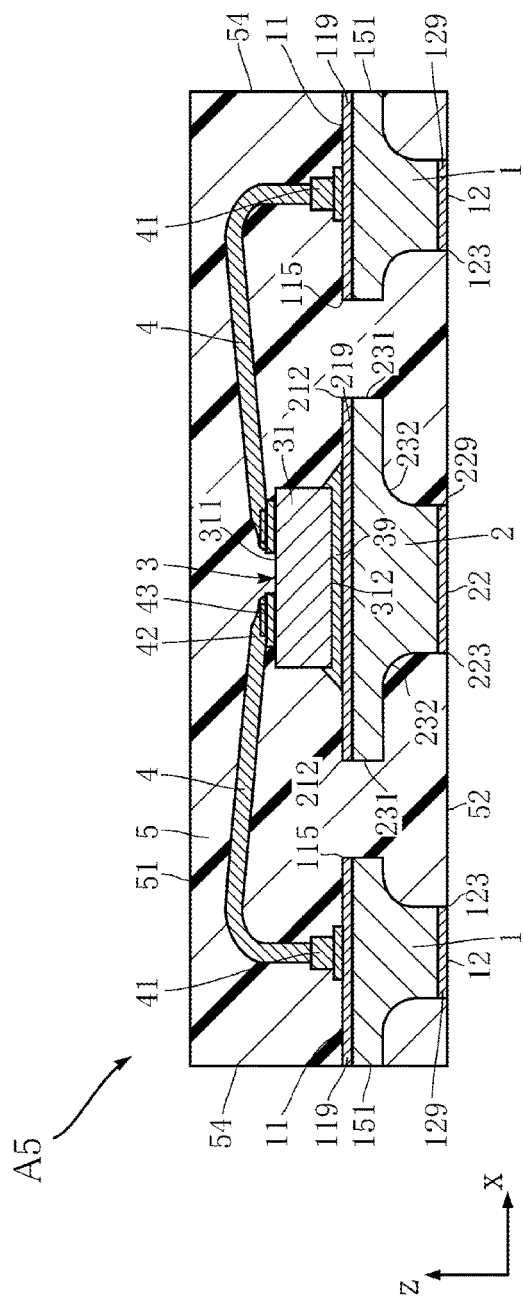
FIG. 25 is a cross-sectional view along line XXV-XXV of FIG. 23.
Figure 26:
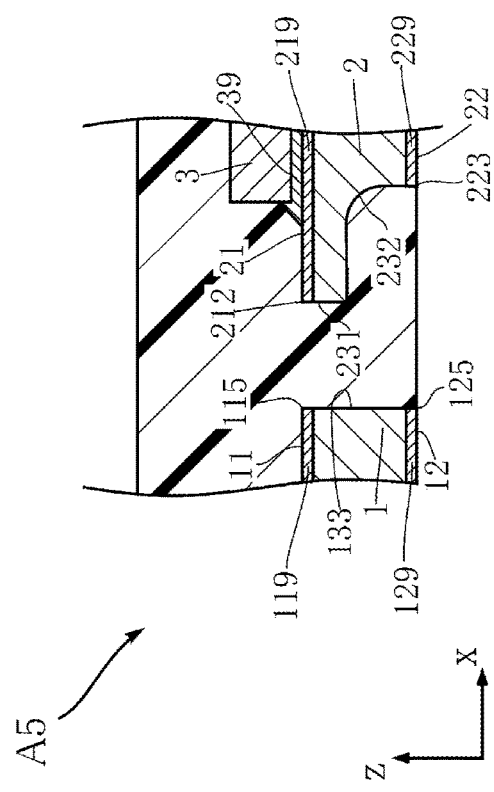
FIG. 26 is a cross-sectional view along line XXVI-XXVI of FIG. 23.

As shown in FIG. 25 and FIG. 26, the island side surface 231 is a surface that is connected to the island surface protruding portion 212 and is along the z direction. In the present embodiment, the island side surface 231 is a curved surface that protrudes toward the terminal portion 1 as viewed in the z direction.

As shown in FIG. 23, the end edge of the terminal surface 11 of the terminal portion 1 includes a terminal surface recess portion 115 opposed to the island surface protruding portion 212 of the island surface 21 as viewed in the z direction. The terminal surface recess portion 115 is a portion that corresponds to the terminal surface inclined portion 111. The terminal surface recess portion 115 is formed of a curve that is recessed toward the inside of the terminal portion 1. Thus, the shape of the terminal surface recess portion 115 corresponds to the island surface protruding portion 212 of the island portion 2.

As shown in FIG. 24, the end edge of the terminal back surface 12 of the terminal portion 1 includes a terminal back surface recess portion 125 opposed to the island portion 2 as viewed in the z direction. The terminal back surface recess portion 125 is a portion corresponding to the terminal back surface inclined portion 121. The terminal back surface recess portion 125 is formed of a curve that is recessed toward the inside of the terminal portion 1.

As shown in FIG. 23 and FIG. 24, as viewed in the z direction, the terminal back surface recess portion 125 is a structure overlapping the terminal surface recess portion 115. Therefore, in the present embodiment, terminal concave surface 133 that is connected to the terminal surface recess portion 115 and the terminal back surface recess portion 125 in the z direction and is along the z direction is present on the terminal portion 1. As viewed in the z direction, the terminal concave surface 133 is a curved surface that is recessed toward the inside of the terminal portion 1. Further, the terminal concave surface 133 is smoothly connected to the terminal inclined surface 131. In addition, no terminal first thin wall portion 13 is formed in the terminal portion 1 in the present embodiment.

As shown in FIG. 23 and FIG. 24, the terminal portion 1 includes a terminal thin wall portion 18. In the present embodiment, the terminal thin wall portion 18 is a portion corresponding to the terminal second thin wall portion 14 and the terminal third thin wall portion 15. The thickness of the terminal thin wall portion 18 is smaller than the distance between the terminal surface 11 and the terminal back surface 12, i.e. the maximum thickness of the terminal portion 1. The thickness is about ¼~½ of the maximum thickness. Further, the terminal thin wall portion 18 includes a portion of the terminal surface 11.

As shown in FIG. 23, the distance d3 between the terminal surface side portions 113 of the terminal portion 1 which are arranged to face each other in the y direction is longer than the distance d4 between the terminal surface recess portion 115 and the island surface protruding portion 212 facing each other. In addition, the distance d4 is the same as the distance d5 between the terminal surface front portion 112 and the island second thin wall portion 24 facing each other.

The Hall element 3 has a rectangular shape as viewed in the z direction. In the same manner as the Hall element module A1, the Hall element 3 is mounted on the island surface 21 with diagonals along the x direction and the y direction.

Then, the effect of the Hall element module A5 is illustrated.

According to the present embodiment, as shown in FIG. 23, the end edge of the island surface 21 of the island portion 2 includes an island surface protruding portion 212 opposed to the terminal portion 1 and protruding toward the terminal portion 1 as viewed in the z direction. By this configuration, the area of the island surface 21 on which the Hall element 3 is mounted can be ensured, and the miniaturization of the Hall element module A5 can be achieved.

The island surface protruding portion 212 is formed of a curved line. In the present embodiment, the shape of the island surface 21 other than the island second thin wall portion 24 has an elliptic shape with an axis in the x direction. Further, the end edge of the terminal surface 11 of the terminal portion 1 includes a terminal surface recess portion 115 opposed to the island surface protruding portion 212 of the island surface 21 and recessed toward the inside of the terminal portion 1 as viewed in the z direction. By this configuration, in the case that the terminal portion 1 is made close to the Hall element 3 for the miniaturization of the Hall element module A5, the shortest distance between the terminal portion 1 and the island portion 2 as viewed in the z direction would not be improperly reduced. Further, the Hall element 3 is mounted on the island surface 21 with diagonals along the x direction and the y direction, but even in other configurations or arrangements, the Hall element 3 is not exposed from the island surface 21. Hence, the miniaturization of the Hall element module A5 can be achieved.

Herein, as shown in FIG. 14, when the Hall element 3 is mounted on the island surface 21 by chip bonding, the bonding material 39 is diffused in a circular shape as viewed in the z direction. Thus, by the shape of the island surface 21, the bonding material 39 diffused on the island surface 21 is adhered to the entire element back surface 312 of the Hall element 3 as viewed in the z direction. Thus, the bonding strength of the Hall element 3 to the island portion 2 can be increased.

Sixth Embodiment

FIG. 27 to FIG. 32 show a Hall element module A6 according to the sixth embodiment of the present invention. The Hall element module A6 is different from the Hall element module A1 in the shapes of the terminal portion 1 and the island portion 2.

Figure 27:
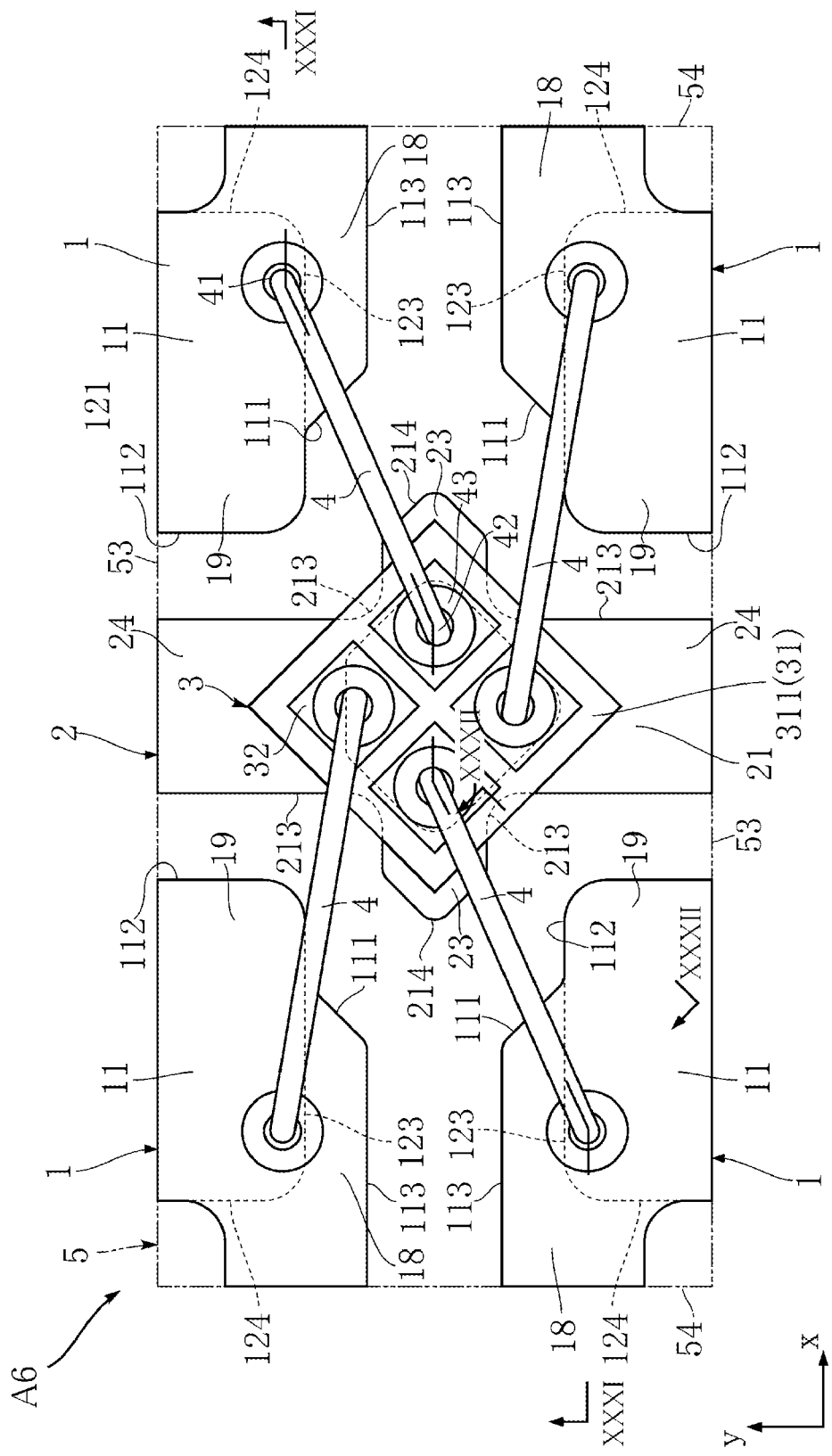
FIG. 27 is a top view of a Hall element module according to the sixth embodiment of the present invention.

As shown in FIG. 27, an end edge of an island surface 21 of the island portion 2 includes an island surface recess portion 213 opposed to the terminal portion 1 as viewed in the z direction. The island surface recess portion 213 is formed into a shape that is inwardly recessed and overlapped with an element body 31 of the Hall element 3 as viewed in the z direction. In the present embodiment, the island surface recess portion 213 is in an L shape as viewed in the z direction.

Figure 29:
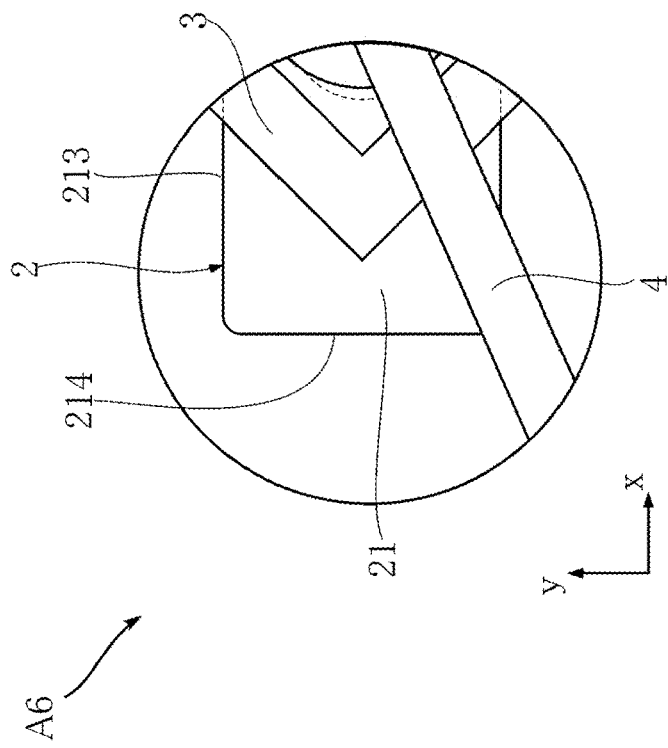
FIG. 29 is a partially enlarged top view showing a variation of the Hall element module of FIG. 27.
Figure 28:
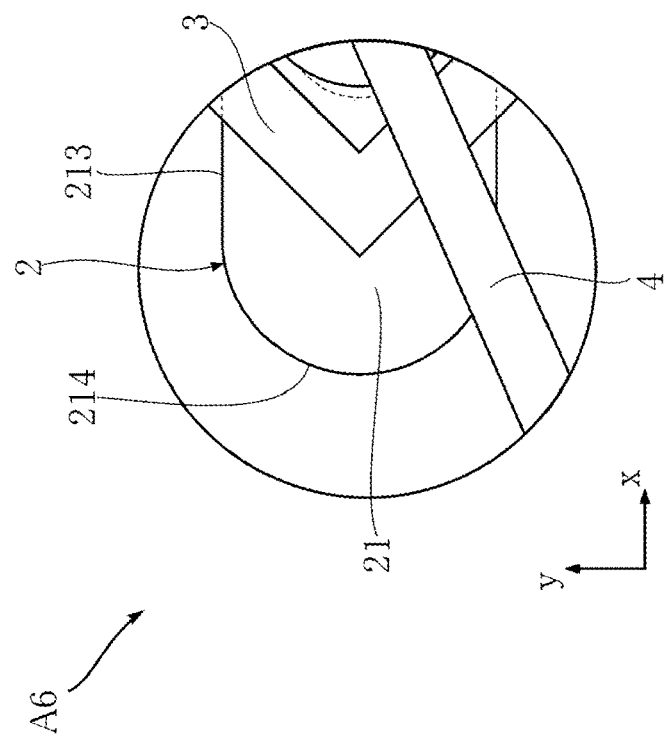
FIG. 28 is a partially enlarged top view showing a variation of the Hall element module of FIG. 27.

As shown in FIG. 27, an edge of the island surface 21 of the island portion 2 includes an island surface front portion 214 toward the x direction. Two ends of the island surface front portion 214 are connected to the island surface recess portion 213. In the present embodiment, the island surface front portion 214 is formed into a shape sharpened toward the x direction. Further, the shape of the island surface front portion 214 can be arc-shaped as shown in FIG. 28, or can be linear as shown in FIG. 29.

Figure 30:
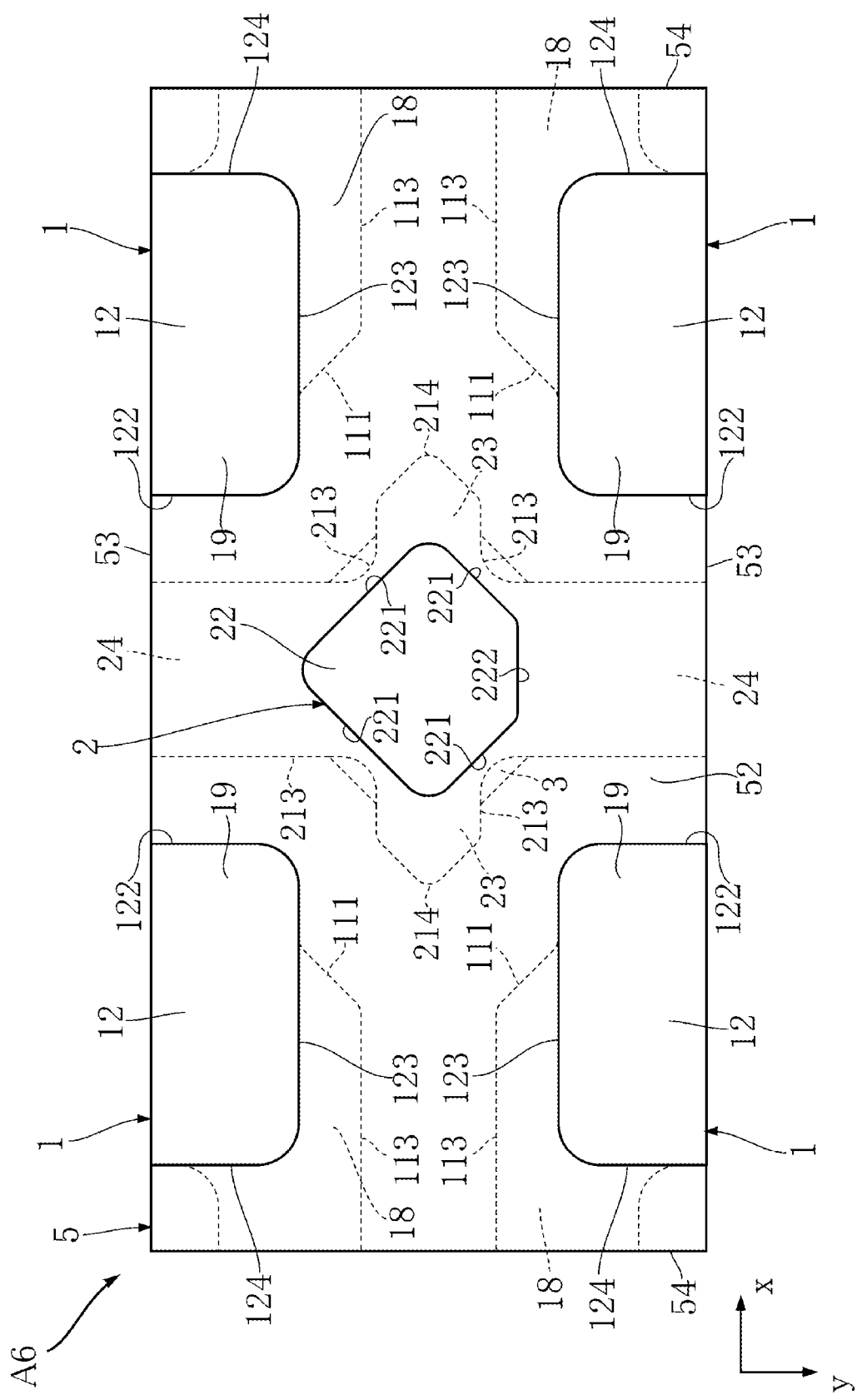
FIG. 30 is a bottom view of the Hall element module of FIG. 27.
Figure 31:
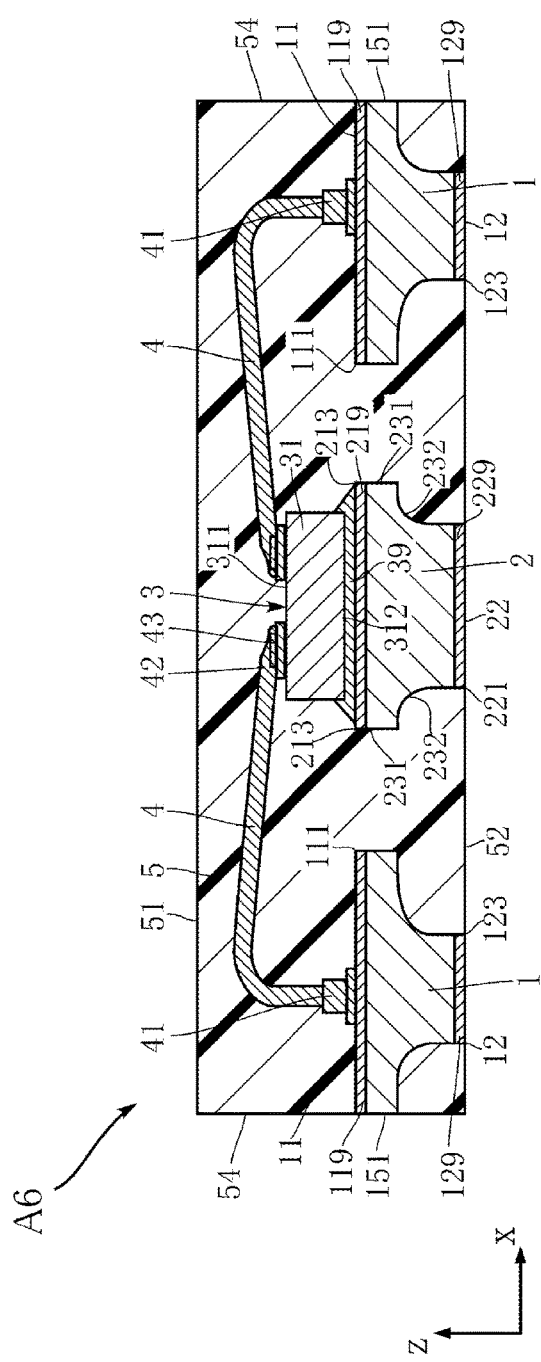
FIG. 31 is a cross-sectional view along line XXXI-XXXI of FIG. 27.
Figure 32:
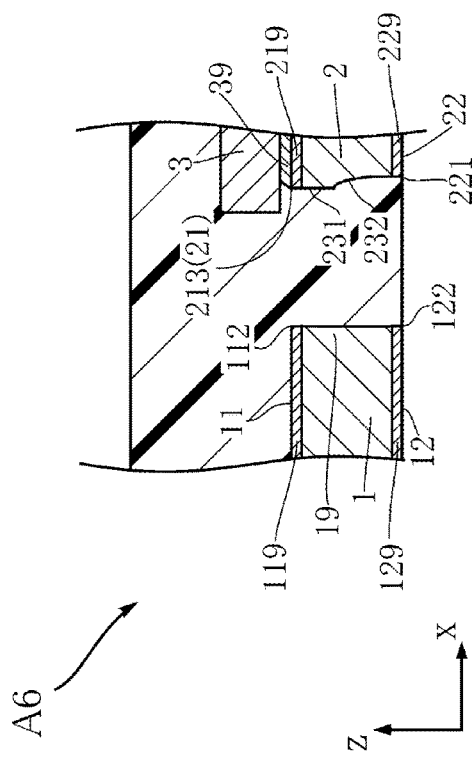
FIG. 32 is a cross-sectional view along line XXXII-XXXII of FIG. 27.

As shown in FIG. 30, an end edge of the island back surface 22 of the island portion 2 includes four island back surface inclined portions 221 and an island back surface parallel portion 222. Thus, the shape of the island back surface 22 is the same as that of the Hall element module A1. Further, as shown in FIG. 31 and FIG. 32, an island side surface 231 is connected to the island surface recess portion 213 and the island surface front portion 214 and is along the z direction. In the present embodiment, the island side surface 231 is a curved surface, and includes a portion protruding toward the x direction as viewed in the z direction and a portion recessed inwardly and overlapped with the Hall element 3.

As shown in FIG. 27, an end edge of the terminal surface 11 of the terminal portion 1 includes a terminal surface inclined portion 111 opposed to the island surface recess portion 213 of the island surface 21 as viewed in the z direction. Similar to the Hall element module A1, the terminal surface inclined portion 111 is opposed to the Hall element 3 as viewed in the z direction, and is inclined with respect to the x direction and the y direction. Further, an end edge of the terminal surface 11 includes a terminal surface front portion 112 connected to the terminal surface inclined portion 111. In the present embodiment, the terminal surface front portion 112 is formed into an L shape along the x direction and the y direction.

As shown in FIG. 30, the terminal back surface 12 of the terminal portion 1 includes no terminal back surface inclined portion 121. That is, the terminal back surface front portion 122 is connected to the terminal back surface side portion 123. Therefore, the terminal back surface 12 is rectangular in the present embodiment.

As shown in FIG. 27 and FIG. 30, the terminal portion 1 includes a terminal thin wall portion 18. In the present embodiment, the terminal thin wall portion 18 is a portion corresponding to the terminal first thin wall portion 13, the terminal second thin wall portion 14 and the terminal third thin wall portion 15. The thickness of the terminal thin wall portion 18 is smaller than the distance between the terminal surface 11 and the terminal back surface 12, i.e. the maximum thickness of the terminal portion 1. The thickness is about ¼~½ of the maximum thickness. In addition, the terminal thin wall portion 18 includes a portion of the terminal surface 11.

As shown in FIG. 27 and FIG. 30, the terminal portion 1 includes a terminal protruding portion 19 protruding toward the island surface recess portion 213 from the terminal thin wall portion 18 as viewed in the z direction. The terminal protruding portion 19 is a triangular prism-shaped portion sandwiched by the terminal surface front portion 112, the terminal back surface front portion 122, and the terminal back surface side portion 123 in the z direction. Further, the terminal protruding portion 19 has a portion of each of the terminal surface 11 and the terminal back surface 12. The thickness of the terminal protruding portion 19 is the same as the distance between the terminal surface 11 and the terminal back surface 12, i.e. the maximum thickness of the terminal portion 1.

The Hall element 3 is rectangular as viewed in the z direction. In the same manner as the Hall element module A1, the Hall element 3 is mounted on the island surface 21 with diagonals along the x direction and the y direction.

Then, the effect of the Hall element module A6 is illustrated.

According to the embodiment, as shown in FIG. 27, an end edge of the island surface 21 of the island portion 2 includes an island surface recess portion 213 opposed to the terminal portion 1 as viewed in the z direction and recessed inwardly and overlapped with the Hall element 3. By this configuration, in the case that the terminal portion 1 is made close to the Hall element 3 for the miniaturization of the Hall element module A6, the shortest distance between the terminal portion 1 and the island portion 2 as viewed in the z direction would not be improperly reduced. Hence, the miniaturization of the Hall element module A6 can be achieved.

The terminal portion 1 includes a terminal protruding portion 19 protruding toward the island surface recess portion 213 of the island surface 21 from the terminal thin wall portion 18 as viewed in the z direction. Therefore, the miniaturization of the Hall element module A6 can be achieved, and the area of the terminal surface 11 and the terminal back surface 12 can be expanded. By expanding the area of the terminal surface 11, the bonding strength of the terminal portion 1 to the wire 4 (the first bonding portion 41 or the second bonding portion 42) is increased. In addition, by expanding the area of the terminal back surface 12, the mounting strength of the Hall element module A6 with respective to a circuit substrate is improved.

Seventh Embodiment

Figure 33:
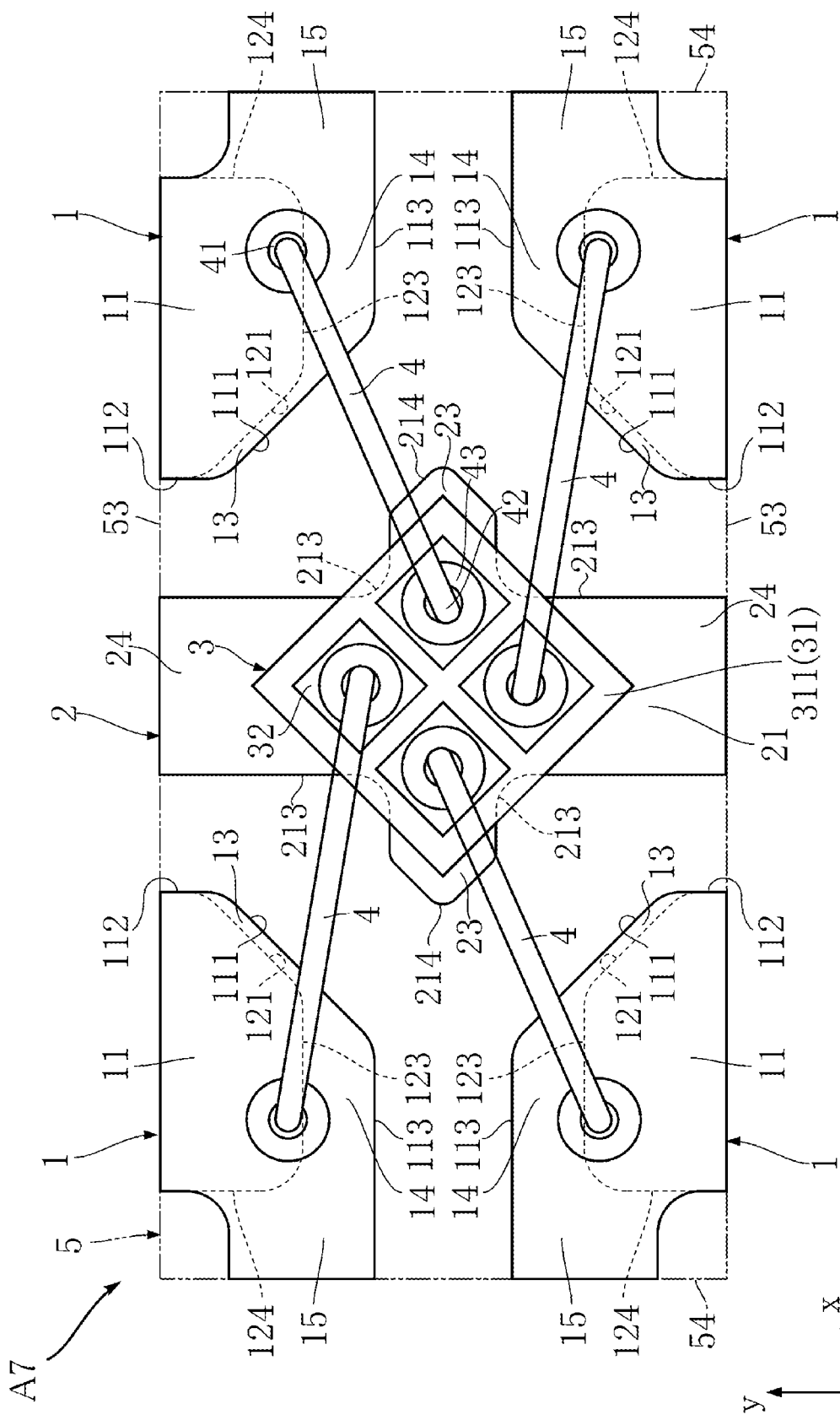
FIG. 33 is a top view of a Hall element module according to the seventh embodiment of the present invention.
Figure 34:
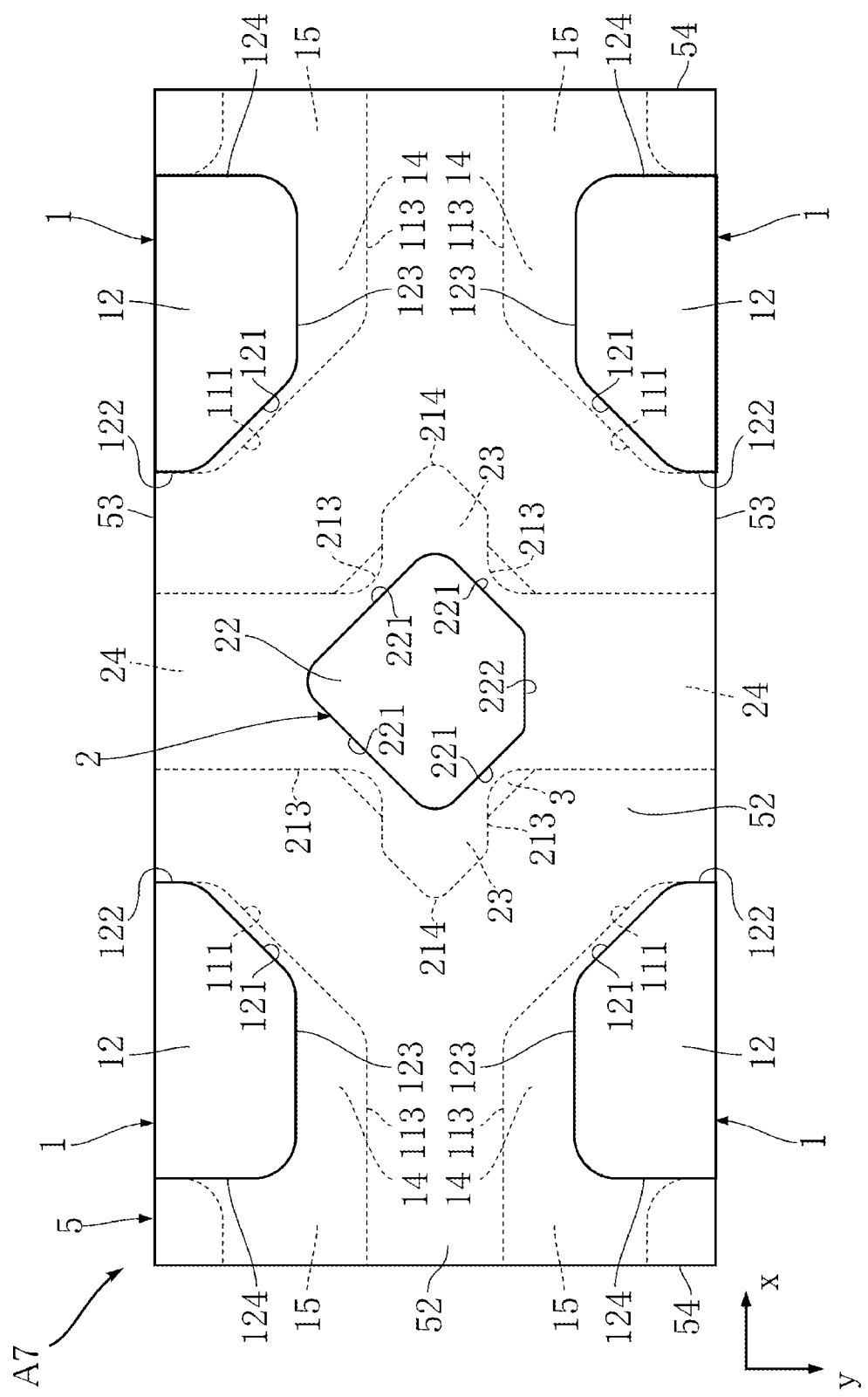
FIG. 34 is a bottom view of the Hall element module of FIG. 33.

FIG. 33 and FIG. 34 show a Hall element module A7 according to the seventh embodiment of the present invention. The Hall element module A7 is different from the Hall element module A1 in the shape of the island portion 2.

As shown in FIG. 33 and FIG. 34, the shape of the island portion 2 is the same as the shape of the island portion 2 of the Hall element module A6. Further, similar to the Hall element module A6, the island surface front portion 214 has a shape sharpened toward the x direction shown in FIG. 33. The shape may be arc-shaped as shown in FIG. 28 or linear as shown in FIG. 29.

According to this embodiment, the miniaturization of the Hall element module A7 can also be achieved. The specific effect of the Hall element module A7 is the same as that of the Hall element module A1.

The Hall element module of the present invention is not limited to the above embodiments. The configuration of each portion of the Hall element module of the present invention can be freely changed in various designs.

The technical configuration of the Hall element module of the present invention is illustrated in the following notes.

[Note 1A]
A Hall element module, comprising:
a Hall element;
an island portion, having an island surface for mounting the Hall element;
a terminal portion, electrically connected to the Hall element and separated from the Hall element as viewed in the thickness direction; and
a resin package, covering a portion of each of the island portion and the terminal portion and the Hall element,
wherein an end edge of the island surface includes an island surface protruding portion opposed to the terminal portion and protruding toward the terminal portion as viewed in the thickness direction.

[Note 2A]
The Hall element module according to Note 1A, wherein the island surface protruding portion is formed of a curved line.

[Note 3A]
The Hall element module according to Note 1A or 2A, wherein
the terminal portion includes a terminal surface facing in the same direction as the island surface,
an end edge of the terminal surface includes a recess portion opposed to the island surface and recessed toward the inside of the terminal portion as viewed in the thickness direction.

[Note 4A]
The Hall element module according to Note 3A, wherein
the terminal portion includes a terminal back surface toward a side opposite to the terminal surface in the thickness direction, and includes a terminal thin wall portion, and the terminal thin wall portion includes a portion of the terminal surface and a thickness smaller than a distance between the terminal surface and the terminal back surface.

[Note 5A]
The Hall element module according to any of Notes 1A to 4A, wherein
the island portion includes an island back surface facing to a side opposite to the island surface and exposed from the resin package in the thickness direction, and an end edge of the island back surface includes an island back surface parallel portion parallel to the first direction.

[Note 6A]
The Hall element module according to any of Notes 1A to 5A, wherein
the Hall element is rectangular as viewed in the thickness direction, and arranged with diagonals along the first direction and the second direction.

[Note 1B]
A Hall element module, comprising:
a Hall element;
an island portion, having an island surface for mounting the Hall element;
a terminal portion, electrically connected to the Hall element and separated from the Hall element in the thickness direction; and
a resin package, covering a portion of each of the island portion and the terminal portion and the Hall element,
wherein an end edge of the island surface includes an island surface recess portion opposed to the terminal portion and recessed inwardly and overlapped with the Hall element as viewed in the thickness direction.

[Note 2B]
The Hall element module according to Note 1B, wherein the island surface recess portion is formed into a curved shape as viewed in the thickness direction.

[Note 3B]
The Hall element module according to Note 2B, wherein the Hall element has a square shape as viewed in the thickness direction, and is arranged with diagonals along the first direction and the second direction.

[Note 4B]
The Hall element module according to Note 3B, wherein the terminal portion includes a terminal back surface facing to a side opposite to the terminal surface in the thickness direction, and includes a terminal thin wall portion, and the terminal thin wall portion includes a portion of the terminal surface and a thickness smaller than a distance between the terminal surface and the terminal back surface.

[Note 5B]
The Hall element module according to Note 4B, wherein the terminal portion includes a terminal protruding portion protruding toward the recess portion from the terminal thin wall portion as viewed in the thickness direction.

What is claimed is:
1. A Hall element module, comprising:
an island portion, wherein the island portion has an island surface and an island back surface opposite to the island surface, the island surface comprises a curved protruding portion; and
a Hall element having an element surface and an element back surface, wherein the element back surface is mounted on the island surface of the island portion, and a total area of the island back surface is less than a total area of the element back surface.

2. The Hall element module of claim 1, further comprising a resin package covering at least a portion of the Hall element, wherein the resin package is in a rectangular shape as viewed in a thickness direction and has four sides along a first direction and a second direction, the first direction and the second direction being perpendicular to the thickness direction and orthogonal to each other.

3. The Hall element module of claim 2, wherein the Hall element has a square shape as viewed in the thickness direction, diagonals of the Hall element are along the first direction and the second direction.

4. The Hall element module of claim 2, wherein the curved protruding portion has an elliptic shape convex along the first direction.

5. The Hall element module of claim 2, wherein island back surface comprises a curve portion and a parallel portion parallel to the first direction.

6. The Hall element module of claim 5, wherein the curve portion connects a first end and a second end of the parallel portion.

7. The Hall element module of claim 2, wherein the island portion further comprises a thin wall portion extends along the second direction.

8. The Hall element module of claim 7, further comprising a first terminal portion electrically connected to the Hall element.

9. The Hall element module of claim 8, wherein the first terminal portion has a terminal surface recess portion recessed inward, the terminal surface recess portion facing the curved protruding portion of the island surface.

10. The Hall element module of claim 9, wherein the terminal surface recess portion has a shape corresponds to the curved protruding portion of the island portion.

11. The Hall element module of claim 9, wherein the first terminal portion further comprises a front portion along the second direction and facing the thin wall portion of the island portion, a distance between the front portion and the thin wall portion is substantially identical to a distance between the terminal surface recess portion and the curved protruding portion of the island surface.

12. The Hall element module of claim 9, further comprising a second terminal portion electrically connected to the Hall element, wherein a distance between the first terminal portion and the second terminal portion along the second direction is greater than a distance between the terminal surface recess portion and the curved protruding portion of the island surface.

13. The Hall element module of claim 12, further comprising a third terminal portion and a fourth terminal portion surrounding the island portion, the third terminal portion and the fourth terminal portion are electrically connected to the Hall element.

14. The Hall element module of claim 8, wherein the first terminal portion has a thin wall terminal portion, the thin wall terminal portion has a thickness about 25% to 50% of a maximum thickness of the first terminal portion.

15. The Hall element module of claim 1, a first distance is between a first position at the curved protruding portion and an edge of the Hall element, a second distance is between a second position at the curved protruding portion and the edge of the Hall element, the first distance is different from the second distance.

16. A Hall element module, comprising:
an island portion, wherein the island portion has an island surface and an island back surface opposite to the island surface, the island surface comprises a curved protruding portion;
a Hall element having an element surface and an element back surface, wherein the element back surface is mounted on the island surface of the island portion; and
a resin package covering at least a portion of the Hall element, wherein the resin package is in a rectangular shape as viewed in a thickness direction and has four sides along a first direction and a second direction, the first direction and the second direction being perpendicular to the thickness direction and orthogonal to each other, wherein the island portion comprises a surface coplanar with one of the four sides of the resin package.

* * * * *